(12) United States Patent
Ryu et al.

(10) Patent No.: US 8,158,445 B2
(45) Date of Patent: Apr. 17, 2012

(54) METHODS OF FORMING PATTERN STRUCTURES AND METHODS OF MANUFACTURING SEMICONDUCTOR DEVICES USING THE SAME

(75) Inventors: Yong-Hwan Ryu, Yongin-si (KR); Jae-Seung Hwang, Suwon-si (KR); Sung-Un Kwon, Jeonju-si (KR); Kyoung-Ha Eom, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/940,535

(22) Filed: Nov. 5, 2010

(65) Prior Publication Data
US 2011/0111532 A1    May 12, 2011

(30) Foreign Application Priority Data

Nov. 11, 2009   (KR) ........................ 10-2009-0108712
Jan. 19, 2010   (KR) ........................ 10-2010-0004570

(51) Int. Cl.
*H01L 21/00*     (2006.01)
(52) U.S. Cl. ............................................... 438/3; 438/9
(58) Field of Classification Search ................ None
See application file for complete search history.

(56) References Cited

U.S. PATENT DOCUMENTS

| 6,831,019 | B1 | 12/2004 | Li et al. | |
|---|---|---|---|---|
| 2010/0018947 | A1* | 1/2010 | Kimura et al. | 216/22 |
| 2010/0032642 | A1* | 2/2010 | Park et al. | 257/4 |
| 2010/0084372 | A1* | 4/2010 | Taniguchi | 216/22 |
| 2010/0112728 | A1* | 5/2010 | Korzenski et al. | 438/3 |
| 2010/0117074 | A1* | 5/2010 | Yamazaki et al. | 257/43 |
| 2010/0264500 | A1* | 10/2010 | Zhu | 257/421 |

FOREIGN PATENT DOCUMENTS

| JP | 2002-038285 | 2/2002 |
|---|---|---|
| JP | 2004-356179 | 12/2004 |
| JP | 2006-060172 | 3/2006 |
| JP | 2006-278457 | 10/2006 |
| JP | 2008-226922 | 9/2008 |
| KR | 10-2005-0111469 | 11/2005 |
| KR | 10-2006-0079455 | 7/2006 |
| KR | 10-0719345 | 5/2007 |
| KR | 10-2007-0081752 | 8/2007 |

OTHER PUBLICATIONS

English language Abstract of Korean Patent Publication No. KR 10-2006-0109718.

* cited by examiner

*Primary Examiner* — Thao P. Le
(74) *Attorney, Agent, or Firm* — Harness, Dickey & Pierce, P.L.C.

(57) ABSTRACT

Methods of forming pattern structures and methods of manufacturing memory devices using the same are provided, the methods of forming pattern structures include forming an etching object layer on a substrate and performing a plasma reactive etching process on the etching object layer using an etching gas including at least ammonia ($NH_3$) gas. The etching object layer includes a magnetic material or a phase change material.

19 Claims, 17 Drawing Sheets

METHODS OF FORMING PATTERN STRUCTURES AND METHODS OF MANUFACTURING SEMICONDUCTOR DEVICES USING THE SAME

CLAIM OF PRIORITY

This application claims priority under 35 USC §119 to Korean Patent Application Nos. 10-2009-0108712 and 10-2010-0004570, filed on Nov. 11, 2009 and Jan. 19, 2010, respectively, in the Korean Intellectual Property Office (KIPO), the contents of each of which are herein incorporated by reference in their entirety.

BACKGROUND

1. Field

Example embodiments relate to methods of forming pattern structures and methods of manufacturing memory devices using the same.

2. Description of the Related Art

A magnetic memory device and a phase change memory device are volatile memory devices and may have high speed read/write operation, and thus are drawing attention as the next generation memory devices.

The magnetic memory device may include a magnetic metal that has not been used for conventional semiconductor memory devices. The magnetic metal may be patterned by a reactive etching process or a physical etching process. However, the etch rate of the magnetic metal may be very low. Additionally, after performing the etching process, patterns may be corroded or a conductive polymer may, be attached to sidewalls of the patterns. When the conductive polymer is attached to the sidewalls of the patterns, upper and lower magnetic materials of a MTJ (Magnetic Tunnel Junction) structure may be electrically short-circuited to each other such that defects in the magnetic memory device may occur.

Meanwhile, the phase change memory device may include a phase change material. By performing conventional etching processes, forming a narrow pitch pattern including the phase change material may be difficult. Moreover, the phase change material may be damaged significantly by an etching gas so that elements included in the phase change material may be changed after the etching processes.

Therefore, a suitable etching process for patterning the above materials used for the next generation of memory devices, like magnetic memory devices and phase change memory device, is required.

SUMMARY

Example embodiments relate to methods of forming pattern structures and methods of manufacturing memory devices using the same.

Example embodiments provide methods of forming pattern structures including a magnetic metal or a phase change material.

Example embodiments provide methods of manufacturing magnetic memory devices using the methods of forming the pattern structures including the magnetic metal.

Example embodiments provide methods of manufacturing phase change memory devices using the methods of forming the pattern structures including the phase change material.

According to some example embodiments, a method of forming pattern structures may include forming an etching object layer on a substrate, and performing a plasma reactive etching process on the etching object layer using an etching gas including at least ammonia ($NH_3$) gas. The etching object layer includes a magnetic material or a phase change material.

In example embodiments, the etching object layer may include an alloy of at least two elements selected from the group consisting of cobalt (Co), iron (Fe), terbium (Tb), ruthenium (Ru), palladium (Pd), platinum (Pt) manganese (Mn) and combinations thereof.

In example embodiments, the etching gas further may include a fluorine containing gas.

In example embodiments, the fluorine containing gas may include at least one selected from the group consisting of sulfur hexafluoride ($SF_6$), nitrogen trifluoride ($NF_3$), silicon tetrafluoride ($SiF_4$), carbon tetrafluoride ($CF_4$) and combinations thereof.

In example embodiments, a flow rate of ammonia gas included in the etching gas may be substantially the same as, or more than, that of the fluorine containing gas included in the etching gas.

In example embodiments, the method of forming pattern structures may further include removing a polymer attached to sidewalls of the pattern structures.

In example embodiments, the etching object layer may include an alloy of at least three elements selected from the group consisting of germanium (Ge), antimony (Sb), tellurium (Te), indium (In), bismuth (Bi) and combinations thereof.

In example embodiments, the etching gas may include ammonia gas and at least one selected from the group consisting of argon, $CF_4$, carbon monoxide (CO), hydrogen bromide (HBr), $SF_6$ and combinations thereof.

In example embodiments, each element in the pattern structures may have a difference of proportion less than about 5% between before and after performing the plasma reactive etching process.

In example embodiments, a gap between the pattern structures may be less than about 1000 Å.

In example embodiments, an acute angle of sidewalls of the pattern structures with respect to a top surface of the substrate may be equal to or more than 80°.

According to some example embodiments, a method of manufacturing a magnetic memory device may include forming a cell selection device on a substrate, forming an insulating interlayer on the substrate to cover the cell selection device, forming a lower magnetic layer, a tunnel barrier layer and an upper magnetic layer on the insulating interlayer, forming a mask on the upper magnetic layer, and performing a plasma reactive etching process on the upper magnetic layer, the tunnel barrier layer and the lower magnetic layer using a mixed gas including a fluorine containing gas and ammonia gas as an etching gas to form a MTJ (Magnetic Tunnel Junction) structure.

In example embodiments, the mixed gas further may include an inert gas.

In example embodiments, the plasma reactive etching process may be performed at a temperature of 10° C. to 300° C. and at a pressure of 1 mTorr to 10 mTorr.

In example embodiments, the fluorine containing gas may include at least one selected from the group consisting of $SF_6$, $NF_3$, $SiF_4$, $CF_4$ and combinations thereof.

In example embodiments, the method of manufacturing a magnetic memory device may further include forming an insulative metal oxide layer on a sidewall of the MTJ structure.

In example embodiments, a flow rate of the ammonia gas included in the mixed gas may be substantially the same as, or more than, that of the fluorine containing gas included in the mixed gas.

According to some example embodiments, a method of manufacturing a phase change memory device may include forming a cell selection device on a substrate, forming an insulating interlayer on the substrate to cover the cell selection device, forming a lower electrode contact through the insulating interlayer, the lower electrode contact making contact with the cell selection device, forming a phase change layer electrically connected to the lower electrode contact on the insulating interlayer, performing a plasma reactive etching process on the phase change layer using an etching gas including a fluorine containing gas to form a phase change pattern and forming an upper electrode contacting the phase change pattern.

In example embodiments, the etching gas may include ammonia gas, and at least one selected from the group consisting of argon, $CF_4$, carbon monoxide (CO), hydrogen bromide (HBr), $SF_6$ and combinations thereof.

In example embodiments, an acute angle of sidewalls of the phase change pattern with respect to a top surface of the substrate may be equal to or more than 80° by restraining (or preventing) variations in the composition ratio of the phase change layer during the etching process.

BRIEF DESCRIPTION OF THE DRAWINGS

Example embodiments will be more clearly understood from the following detailed description taken in conjunction with the accompanying drawings.

FIGS. 1 to 3 are cross-sectional views illustrating a method of forming a magnetic pattern in accordance with example embodiments;

FIG. 4 is a timing diagram illustrating inflow of reactive gas in an etching process of a magnetic material layer using a method in accordance with the example embodiments;

FIGS. 5 to 9 are cross-sectional views illustrating a method of manufacturing a magnetic memory device in accordance with example embodiments;

FIGS. 10 to 12 are cross-sectional views illustrating a method of manufacturing a magnetic memory device in accordance with example embodiments;

FIG. 13 is a timing diagram illustrating an inflow of reactive gas in an etching process and a cleaning process of a magnetic material layer in accordance with example embodiments;

FIG. 14 is a timing diagram illustrating an inflow of reactive gas in an etching process and a cleaning process of a magnetic material layer in accordance with example embodiments;

FIG. 15 is a timing diagram illustrating an inflow of reactive gas in an etching process and a cleaning process of a magnetic material layer in accordance with example embodiments;

FIG. 16 is a cross-sectional view illustrating a sample of MTJ structure formed using an etching method in accordance with the example embodiments illustrated with reference to FIGS. 1 to 3;

FIG. 17 is a cross-sectional view illustrating a MTJ structure in accordance with Comparative Examples;

FIG. 18 is a graph showing MR ratios of the MTJ structures in Examples;

FIG. 19 is a graph showing MR ratios of the MTJ structures in Comparative Examples;

FIGS. 20 to 22 are cross-sectional views illustrating a method of forming a phase change pattern in accordance with example embodiments;

FIGS. 23 to 26 are cross-sectional views illustrating a method of manufacturing a phase change memory device in accordance with example embodiments;

FIGS. 27 to 29 are cross-sectional views illustrating a method of manufacturing a phase change memory device in accordance with example embodiments;

FIG. 30 is a graph showing a variation of composition ratio of each phase change pattern of Example 1, Example 2 and Comparative Example 1 in an etching process;

FIG. 31 shows a system including a memory device formed according to example embodiments; and FIG. 32 is a block diagram illustrating a memory card including a semiconductor device in accordance with example embodiments.

DETAILED DESCRIPTION OF EXAMPLE EMBODIMENTS

Figure 1:
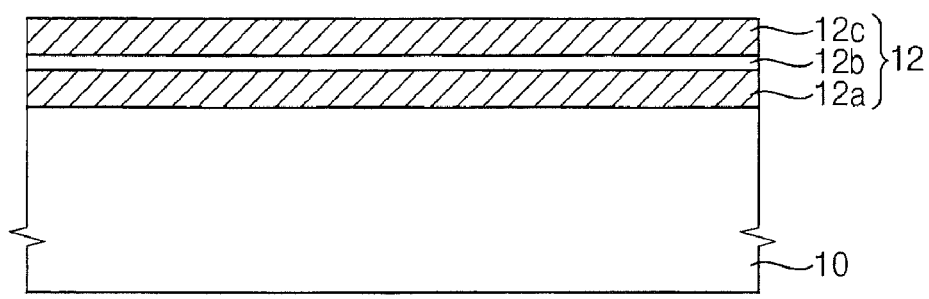
FIGS. 1 to 32 represent non-limiting, example embodiments as described herein.

Various example embodiments will be described more fully hereinafter with reference to the accompanying drawings, in which some example embodiments are shown. The example embodiments of the present inventive concepts may, however, be embodied in many different forms and should not be construed as limited to the example embodiments set forth herein. Rather, these example embodiments are provided so that this description will be thorough and complete, and will fully convey the scope of the example embodiments of the present inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, however do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments of the present inventive concepts.

Unless otherwise defined, all terms (including technical and scientific terms) used herein have the same meaning as commonly understood by one of ordinary skill in the art to which the example embodiments of the inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments relate to methods of forming pattern structures and methods of manufacturing memory devices using the same.

Figure 2:
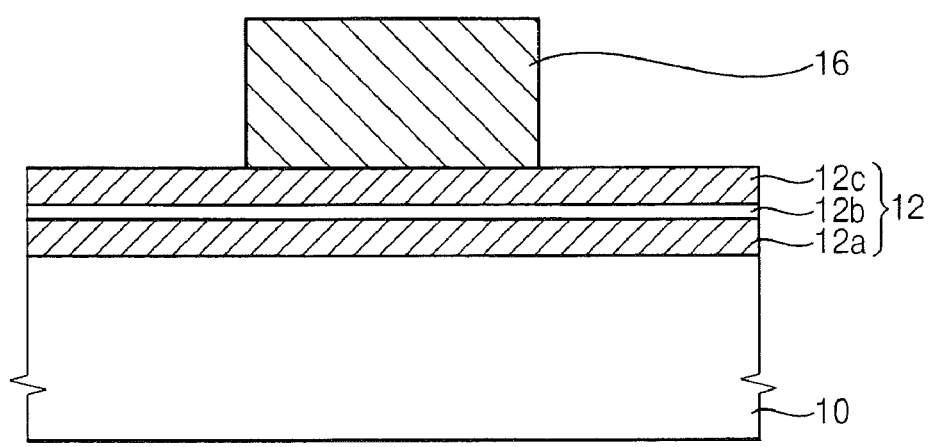
Figure 3:
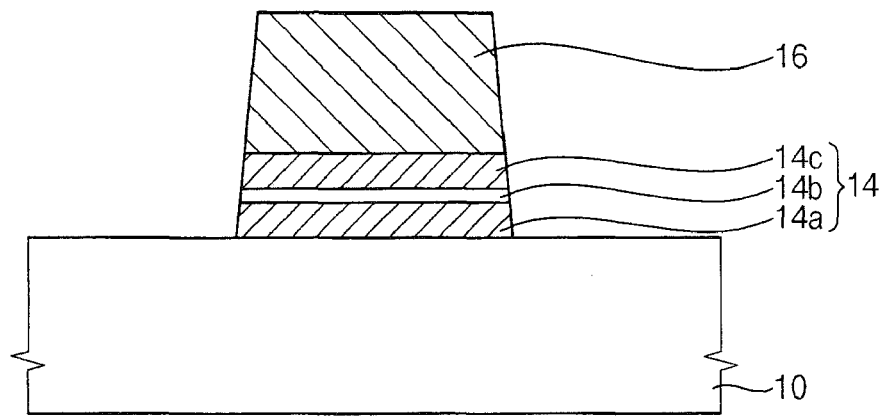

FIGS. 1 to 3 are cross-sectional views illustrating a method of forming a magnetic pattern structure in accordance with example embodiments.

Referring to FIG. 1, a magnetic layer structure 12 may be formed on a substrate 10 using a magnetic material. In example embodiments, the magnetic layer structure 12 may be formed using an alloy including at least two of cobalt (Co), iron (Fe), terbium (Tb), ruthenium (Ru), palladium (Pd), platinum (Pt) and manganese (Mn), and combinations thereof.

In the present example embodiments, the magnetic layer structure 12 may be formed to have a stacked structure for forming a Magnetic Tunnel Junction (MTJ) structure. For example, the magnetic layer structure 12 may be formed by sequentially stacking a lower magnetic layer 12a, a tunnel barrier layer 12b and an upper magnetic layer 12c on the substrate 10.

The lower magnetic layer 12a may be formed by depositing at least two of Co, Fe, Tb, Ru, Pd, Pt, Mn and/or iridium (Ir), etc. The lower magnetic layer 12a may have a magnetization fixed in one direction. The lower magnetic layer 12a may have a single-layered structure or a multi-layered structure.

The tunnel barrier layer 12b may be formed using a metal oxide having an insulating property (e.g., magnesium oxide (MgO), an aluminum oxide ($AlO_x$), or a similar compound).

The upper magnetic layer 12c may be formed by depositing at least two of Co, Fe, Tb, Ru, Pd, Pt, Mn and/or nickel (Ni). The upper magnetic layer 12c may have a magnetization that may not be fixed in one direction but the direction of the magnetization thereof may be reversed. For example, the upper magnetic layer 12c may be formed using cobalt iron boron (CoFeB), cobalt iron (CoFe), and/or nickel iron (NiFe).

In example embodiments, the lower magnetic layer 12a may serve as a fixed layer having a fixed magnetization direction and the upper magnetic layer 12c may serve as a free layer having a switchable magnetization direction. Alternatively, the lower magnetic layer 12a may serve as a free layer and the upper magnetic layer 12c may serve as a fixed layer.

Referring to FIG. 2, a mask layer may be formed on the magnetic layer structure 12. The mask layer may be formed using a metal or a metal nitride (e.g., titanium, titanium nitride, tantalum, tantalum nitride, tungsten, tungsten nitride, or similar compound(s)). These may be used alone or in a combination thereof. The mask layer may be formed to have a single-layered structure, or a multi-layered structure. The mask layer may be patterned to form a mask 16.

Referring to FIG. 3, the magnetic layer structure 12 may be etched using the mask 16 as an etching mask by a plasma reactive etching process. In the etching process, a mixed gas including a fluorine containing gas and ammonia gas may serve as a reactive gas, (i.e., an etching gas). Accordingly, a magnetic pattern structure 14 including a lower magnetic pattern 14a, a tunnel barrier layer pattern 14b and an upper magnetic pattern 14c sequentially stacked on the substrate 10 may be formed on the substrate 10.

Examples of the fluorine containing gas may include sulfur hexafluoride ($SF_6$), nitrogen trifluoride ($NF_3$), silicon tetrafluoride ($SiF_4$), carbon tetrafluoride ($CF_4$) or combinations thereof. These may be used alone, or in combinations thereof. $SF_6$ may be used for preventing a polymer from being attached to a sidewall of the magnetic pattern structure 14. Hereinafter, only the case in which $SF_6$ serves as the fluorine containing gas is illustrated for the convenience of explanation.

An ammonia gas may be reacted with a metal of the magnetic layer structure 12 to generate a metal ammonium. The metal ammonium may be volatilized so that the magnetic layer structure 12 may be etched. The ammonia gas may etch the magnetic layer structure 12 rapidly.

$SF_6$ may be reacted with the metal of the magnetic layer structure 12 to generate a metal fluoride. The metal fluoride may be volatilized so that the magnetic layer structure 12 may be etched. $SF_6$ may rapidly etch a specific metal (e.g., Pt). Sulfur included in $SF_6$ may be combined with nitrogen included in ammonia gas and be volatilized, thereby removing a polymer generated by nitrogen. Additionally, fluorine anions (F) of $SF_6$ may remove conductive polymers attached to the sidewall of the magnetic pattern structure 14 after etching the magnetic layer structure 12.

Figure 4:
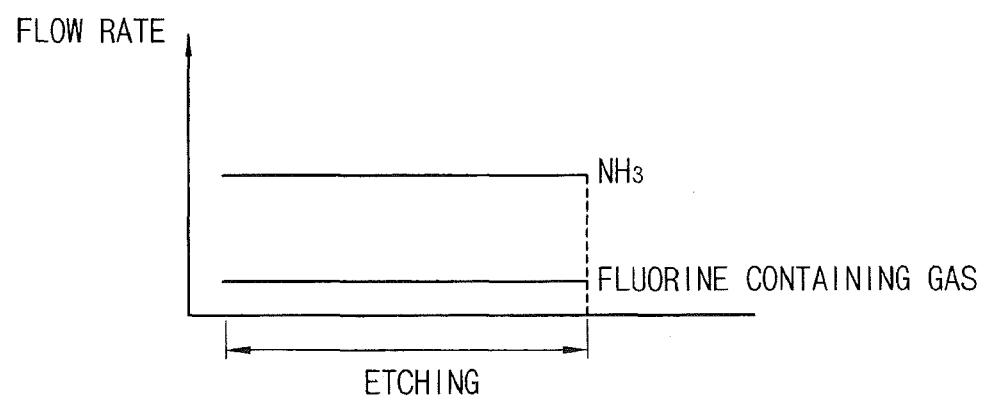

FIG. 4 is a timing diagram illustrating an inflow of the reactive gas in the etching process illustrated with reference to FIGS. 1 to 3.

As described above, an ammonia gas and $SF_6$ may be provided together in the etching process. The etch selectivity of $SF_6$ between the mask 16 and the magnetic layer structure 12 may be lower than that of ammonia gas. Therefore, when the amount of $SF_6$ is increased, the mask 16 may be excessively etched. Therefore, the reactive gas (i.e., the etching gas) may include ammonia gas more than the fluorine containing gas (i.e., $SF_6$). However, when the etching process is performed using only the ammonia gas, a polymer may be generated excessively on the sidewall of the magnetic pattern structure 14. Therefore, $SF_6$ may be also used together with ammonia gas.

As shown in FIG. 4, the ammonia gas may be provided at a flow rate substantially the same as, or more than, that of $SF_6$. In example embodiments, a flow rate ratio between $SF_6$ and ammonia gas may be about 1:1 to 50.

An inert gas may be provided, in addition to the reactive gas, in the etching process. The inert gas may physically etch the magnetic layer structure 12, control the pressure in an etching chamber or activate plasma, etc. The inert gas may include argon. The inert gas may not be necessary but is optional.

Etching conditions for etching the magnetic layer structure 12 may be as follows. The etching process may be performed at a temperature of about 10° C. to about 300° C. and at a pressure of about 10 mTorr. Additionally, a micro-wave power of about 700 W to about 1500 W and R.F. bias power of about 200 W to about 700 W may be applied in the etching process.

As described above, the etching process of the magnetic layer structure 12 may be performed without a chlorine containing gas, thereby reducing the corrosion of the magnetic layer structure 12. The etching process may be performed without a carbon containing gas, thereby preventing the generation of metal carbonyl. Therefore, the magnetic pattern structure 14 may be formed to have a small critical dimension. Furthermore, the etching process is not a physical etching process, thereby preventing a magnetic material from being re-deposited on the sidewall of the magnetic pattern structure 14.

Accordingly, the magnetic pattern structure 14 having a MTJ structure may be formed to have very little (if any) conductive polymer on the sidewall thereof.

FIGS. 5 to 9 are cross-sectional views illustrating a method of manufacturing a magnetic memory device in accordance with example embodiments.

In example embodiments, a Spin Transfer Torque Magnetic Random Access Memory (STT-MRAM) may be manufactured. The etching process illustrated with reference to FIGS. 3 and 4 may be used in example embodiments.

Figure 5:
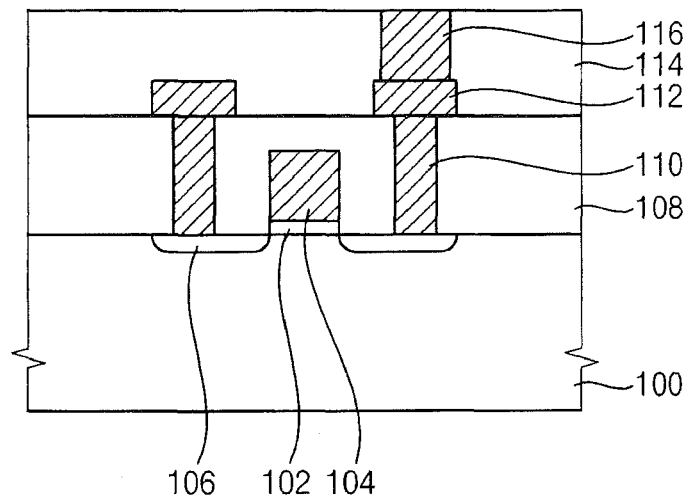

Referring to FIG. 5, an isolation layer pattern (not shown) may be formed on a substrate 100. The isolation layer pattern may divide the substrate 100 into an active region and a field region.

A metal-oxide-semiconductor (MOS) transistor may be formed on the substrate 100. Particularly, a gate oxide layer and a gate electrode layer may be sequentially formed on the substrate 100. The gate electrode layer and the gate oxide layer may be patterned to form a gate electrode 104 and a gate oxide layer pattern 102, respectively. Impurities may be implanted into an upper portion of the substrate 100 adjacent to the gate electrode 104 so that an impurity region 106 may be formed. In example embodiments, the gate electrode 104 may be formed to have a linear shape extending in a first direction and serve as a word line. Gate spacers (not shown) may be further formed on sidewalls of the gate electrode 104.

A first insulating interlayer 108 may be formed on the substrate 100 to cover the MOS transistor. First contact plugs 110 may be formed through the first insulating interlayer 108 to be electrically connected to the impurity region 106. A conductive pattern 112 may be formed on the first insulating interlayer 108 to be electrically connected to the first contact plugs 110.

A second insulating interlayer 114 may be formed on the first insulating interlayer 108 to cover the conductive pattern 112. The second insulating interlayer 114 may be partially removed to form an opening (not shown) exposing a top surface of the conductive pattern 112. A conductive layer may be formed on the conductive pattern 112 and the second insulating interlayer 114 to fill the opening. An upper portion of the conductive layer may be polished until a top surface of the second insulating interlayer 114 is exposed, thereby forming a second contact plug 116.

Figure 6:
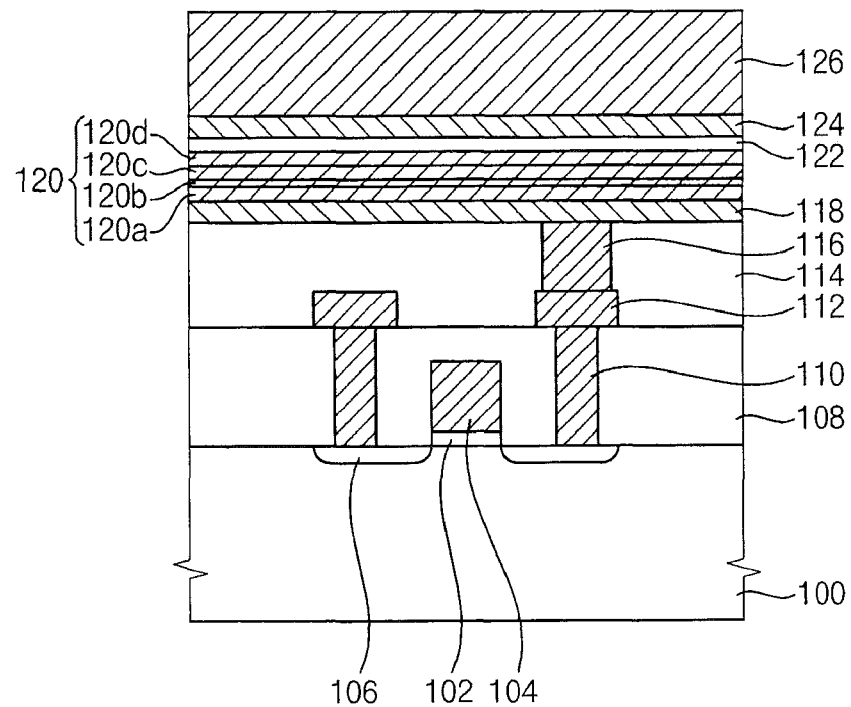

Referring to FIG. 6, a first barrier layer 118, a fixed layer structure 120, a second barrier layer 122 and a free layer 124 may be stacked sequentially on the second insulating interlayer 114 and the second contact plug 116.

The first barrier layer 118 may prevent a metal included in the fixed layer structure 120 from excessively growing. The first barrier layer 118 may be formed using a metal or a metal nitride (e.g., tantalum, tantalum nitride, titanium, titanium nitride, or similar compound(s)). The first barrier layer 118 may be formed using tantalum, tantalum nitride, titanium, titanium nitride, or a similar compound.

The fixed layer structure 120 may be formed to have a multi-layered structure including, for example, a fixed layer 120a, a lower ferromagnetic layer 120b, a diamagnetic coupling spacer layer 120c and an upper ferromagnetic layer 120d.

The fixed layer 120a may be formed using a material fixing the magnetization of the lower ferromagnetic layer 120b in one direction. Examples of the material used for the fixed layer 120a may include iron manganese (FeMn), iridium manganese (IrMn), platinum manganese (PtMn), manganese monoxide (MnO), manganese sulfide (MnS), manganese telluride (MnTe), manganese difluoride ($MnF_2$), iron difluoride ($FeF_2$), iron dichloride ($FeCl_2$), iron monoxide (FeO), cobalt dichloride ($CoCl_2$), cobalt monoxide (CoO), nickel dichloride ($NiCl_2$), nickel monoxide (NiO) and chromium (Cr), or similar compound(s). These may be used alone, or in a combination thereof. The lower and upper ferromagnetic layers 120b and 120d may be formed using at least one of Fe, Ni or Co. In example embodiments, the lower and upper ferromagnetic layers 120b and 120d may be formed using CoFe, NiFe or CoFeB. The diamagnetic coupling spacer layer 120c may be formed using Ru, Ir or rhodium (Rh), etc.

The second barrier layer 122 may serve as a tunnel barrier layer. The second barrier layer 122 may be formed using aluminum oxide, magnesium oxide, etc. When the second barrier layer 122 is formed using magnesium oxide, the second barrier layer 122 may have good magnetoresistance (MR) ratio, and thus the second barrier layer 122 may be formed using aluminum oxide.

A free layer 124 may be formed using a ferromagnetic material including Fe, Ni, Co, etc. These may be used alone, or in a combination thereof. In example embodiments, the free layer 124 may be formed using CoFe, NiFe or CoFeB.

A mask layer 126 may be formed on the free layer 124. The mask layer 126 may be formed using a metal or a metal nitride. For example, the mask layer 126 may be formed using titanium, titanium nitride, tantalum, tantalum nitride, tungsten, tungsten nitride, or a similar compound. These may be used alone, or in a combination thereof.

Figure 7:
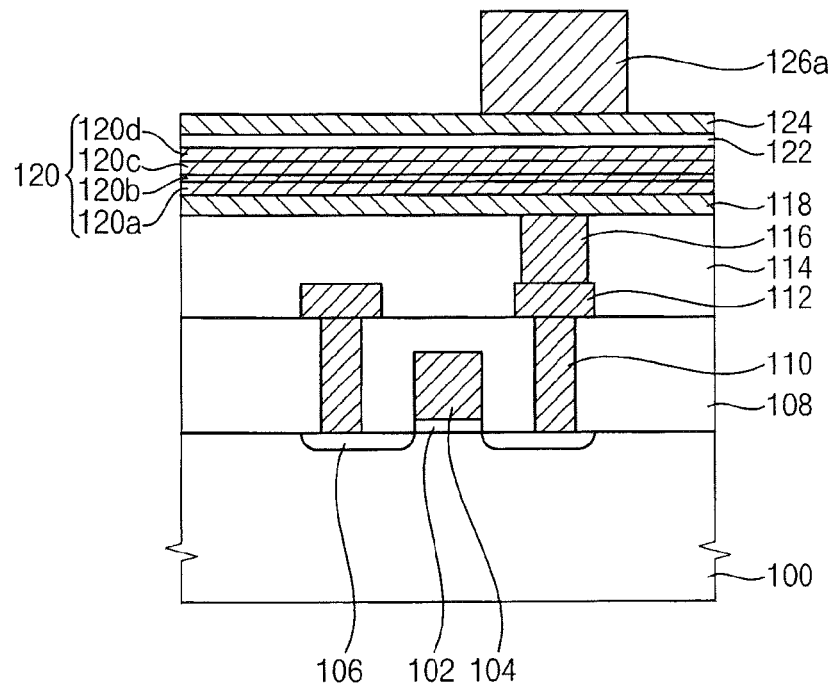

Referring to FIG. 7, the mask layer 126 may be etched anisotropically, thereby forming a mask 126a overlapping (or corresponding to) the second contact plug 116. The mask 126a may serve as an etching mask in an etching process of the fixed layer structure 120.

Figure 8:
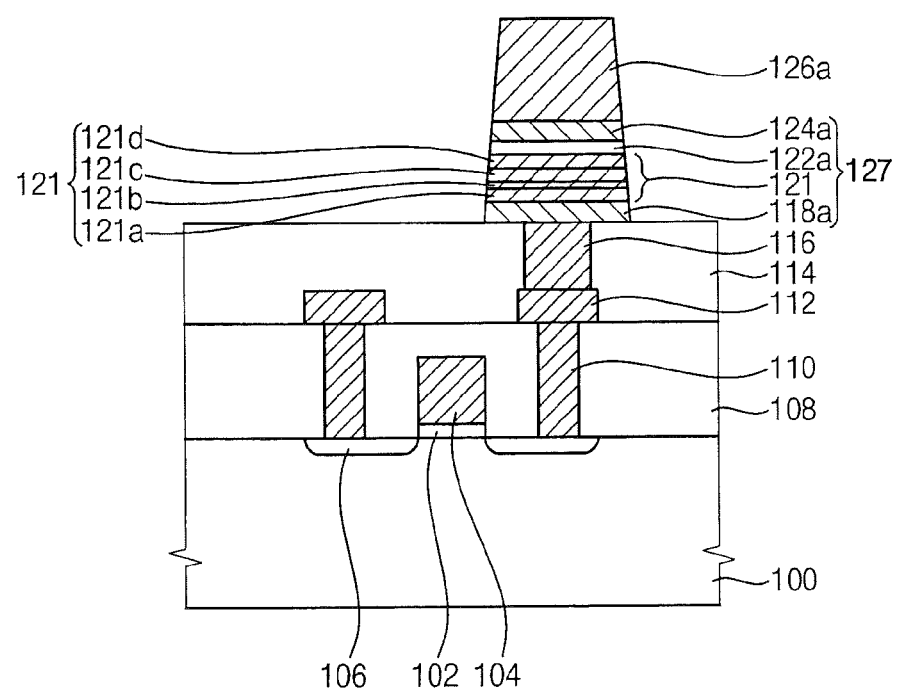

Referring to FIG. 8, the free layer 124, the second barrier layer 122, the fixed layer structure 120 and the first barrier layer 118 may be etched using the mask 126a as the etching mask by a plasma reactive etching process. In the etching process, a reactive gas, which includes a fluorine containing gas and ammonia gas, serving as an etching gas may be provided. The etching process may be substantially the same as that illustrated with reference to FIGS. 3 and 4. By performing the etching process, a MTJ structure 127 may be formed. The MTJ structure 127 may have a first barrier layer pattern 118a, a fixed layer pattern structure 121, a second barrier layer pattern 122a and a free layer pattern 124a sequentially stacked on the second insulating interlayer 114 and the second contact plug 116. As mentioned above, the second barrier layer pattern 122a may serve as a tunnel barrier layer pattern.

Conductive polymers may not be attached to a sidewall of the MTJ structure 127, thereby reducing the electrical short between the fixed layer pattern structure 121 and the free layer pattern 124a.

A capping layer (not shown) for protecting the MTJ structure 127 may be further foamed on the second insulating layer 114. The capping layer may be formed to have a thickness of about 50 Å to about 300 Å. The capping layer may be formed using a metal oxide having an insulating property (e.g., aluminum oxide).

Figure 9:
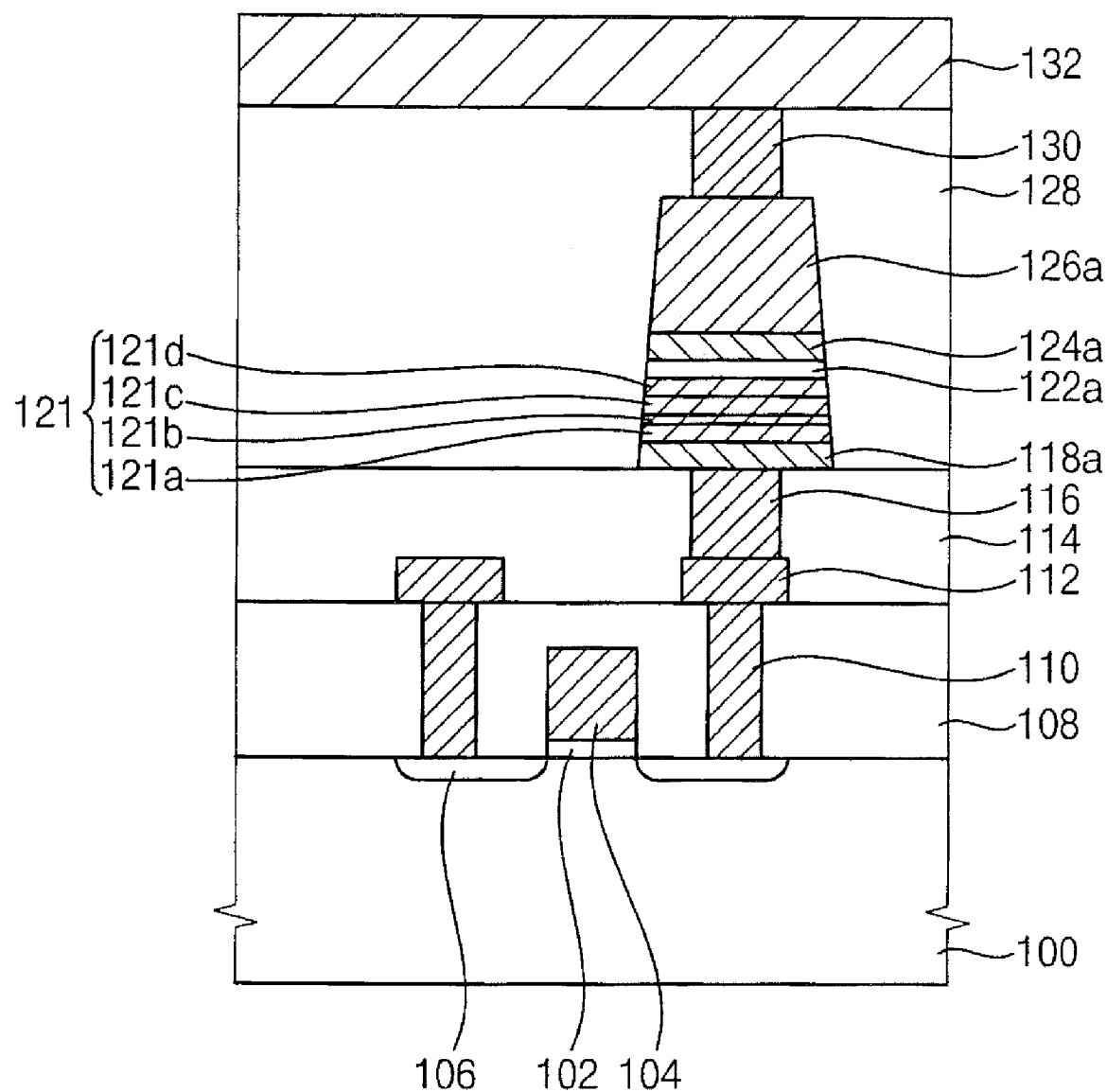

Referring to FIG. 9, a third insulating interlayer 128 may be formed on the second insulating interlayer 114 to cover the MTJ structure 127. The third insulating interlayer 128 may be partially removed to form a contact hole (not shown) exposing a top surface of the mask 126a. A conductive layer may be formed on the mask layer 126a and the third insulating interlayer 128 to fill the contact hole, and an upper portion of the conductive layer may be polished until a top surface of the third insulating interlayer 128 may be exposed, thereby forming a third contact plug 130.

A conductive layer may be formed on the third insulating interlayer 128 to be electrically connected to the third contact plug 130. The conductive layer may be patterned to form a bit line 132. In example embodiments, the bit line 132 may be formed to extend in a second direction perpendicular to the first direction. Alternatively, the bit line 132 may be formed to directly contact the mask 126a without forming the third contact plug 130.

By performing the above processes, the magnetic memory device may be manufactured.

When the magnetization direction of the fixed layer pattern structure 121 is substantially the same as that of the free layer pattern 124a (hereinafter, referred to as a parallel state), the magnetic memory device may have a substantially low resistance. When the magnetization direction of the fixed layer pattern structure 121 is not the same as that of the free layer pattern 124a (hereinafter, referred to as an antiparallel state), the magnetic memory device may have a substantially high resistance. The magnetic memory device may store data using the above difference in the resistance. Therefore, a resistance difference between the parallel state and the antiparallel state may be substantially large resistance. The above resistance difference may be referred to as a Magnetoresistance (MR) Ratio.

When the fixed layer pattern structure 121 and the free layer pattern 124a are short-circuited to each other by a conductive polymer attached to the sidewall of the MTJ structure, an electric current may flow through the conductive polymer, and thus MR may be about 0%.

However, in the MTJ structure in accordance with example embodiments, by-products (e.g., the conductive polymer) may not be attached to the sidewall thereof, so that the magnetic memory device may have a substantially high MR and good operation characteristics. Additionally, the magnetic memory device may have high reliability.

Figure 10:
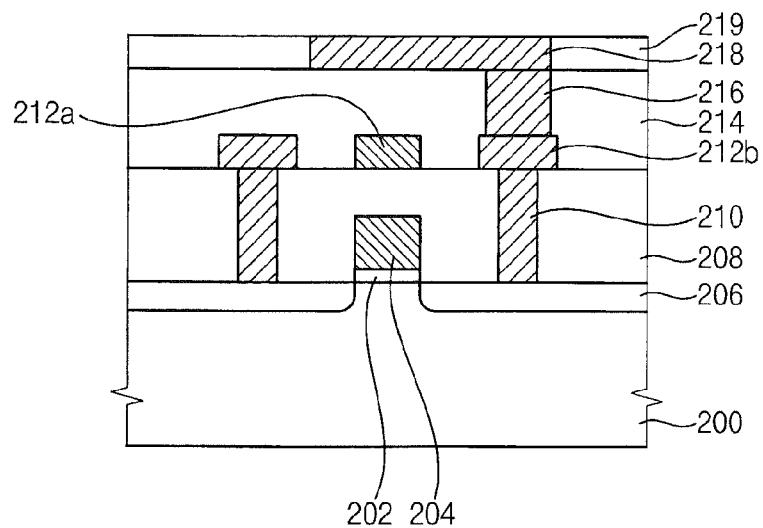
Figure 11:
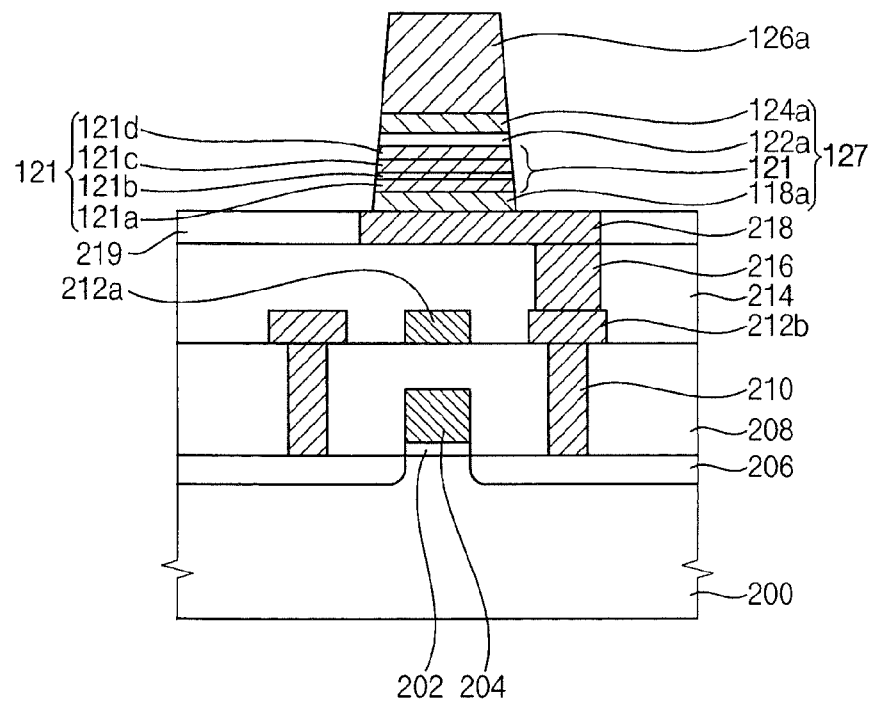
Figure 12:
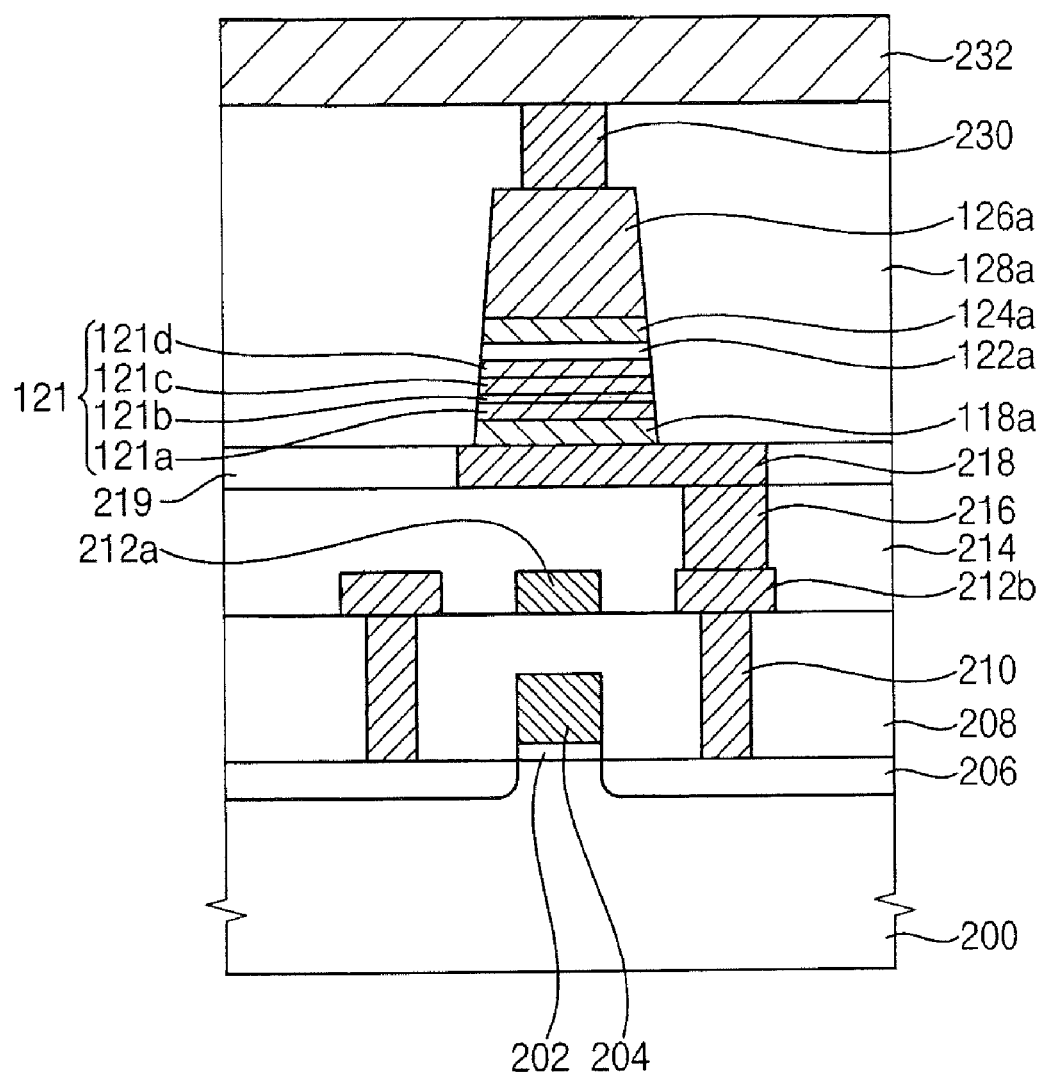

FIGS. 10 to 12 are cross-sectional views illustrating a method of manufacturing a magnetic memory device in accordance with other example embodiments.

The magnetic memory device may generate a magnetization reversal using an external magnetic field. The etching process illustrated with reference to FIGS. 3 and 4 may be used in the following example embodiments.

Referring to FIG. 10, an isolation layer pattern (not shown) may be formed on a substrate 200. The isolation layer pattern may divide the substrate 200 into an active region and a field region. A MOS transistor for selecting cells that may include a gate electrode 204, a gate oxide layer pattern 202 and an impurity region 206 may be formed on the substrate 200. A gate spacer (not shown) may be formed on sidewalls of the gate electrode 204. The gate electrode 204 may be foamed over a gate oxide 202.

A first insulating interlayer 208 may be formed on the substrate 200 to cover the MOS transistor. First contact plugs 210 may be formed through the first insulating interlayer 208 to be electrically connected to the impurity region 206.

A digit line 212a may be formed on the first insulating interlayer 208. The digit line 212a may be formed to overlap (or correspond to) the gate electrode 204 for the purpose of high integration. A pad electrode 212b may be formed on the first insulating interlayer 208 to be electrically connected to the first contact plugs 210.

A second insulating interlayer 214 may be farmed on the first insulating interlayer 208 to cover the digit line 212a and the pad electrode 212b. The second insulating interlayer 214 may be partially removed to form an opening (not shown) exposing a top surface of the pad electrode 212b.

A conductive layer may be formed on the second insulating interlayer 214 and the pad electrode 212b to fill the opening. An upper portion of the conductive layer may be polished until a top surface of the second insulating interlayer 214 is exposed, thereby forming a second contact plug 216.

A conductive layer may be formed on the second contact plug 216 and the second insulating interlayer 214. The conductive layer may be etched to form a bypass line 218 overlapping the digit line 212a. That is, the bypass line 218 may be formed to extend from a top surface of the second contact plug 216 to a portion of the second insulating interlayer 214 over the digit line 212a.

A third insulating interlayer 219 may be formed on the second insulating interlayer 214 between the bypass lines 218.

Referring to FIG. 11, a first barrier layer, a fixed layer structure, a second barrier layer and a free layer may be sequentially formed on the third insulating interlayer 219 and the bypass line 218.

A mask 126a may be formed on the free layer. The free layer, the second barrier layer, the fixed layer structure and the first barrier layer may be etched to form a MTJ structure 127 using the mask 126a as the etching mask. The MTJ structure 127 may include a first barrier layer pattern 118a, a fixed layer pattern structure 121, a second barrier layer pattern 122a and a free layer pattern 124a sequentially stacked on the bypass line 218. The etching process may be performed by a plasma reactive etching process using a mixed gas including a fluorine containing gas and ammonia gas as an etching gas. The etching process may be substantially the same as, or similar to, that illustrated with reference to FIGS. 6 to 8.

Referring to FIG. 12, a fourth insulating interlayer 128a may be formed on the third insulating interlayer 219 and the bypass line 218 to cover the MTJ structure 127. The fourth insulating interlayer 128a may be partially removed to form a contact hole (not shown) exposing a top surface of the mask 126a. A conductive layer may be formed on the fourth insulating interlayer 128a and the mask 126a to fill the contact hole. An upper portion of the conductive layer may be polished until a top surface of the fourth insulating interlayer 128a is exposed, thereby forming an upper electrode contact 230.

A conductive layer may be formed on the fourth insulating interlayer 128a and the upper electrode contact 230. The conductive layer may be patterned to form a bit line 232 to be electrically connected to the upper electrode contact 230. Alternatively, the bit line 232 may be formed to contact directly the mask 126a without the upper electrode contact 230.

Figure 13:
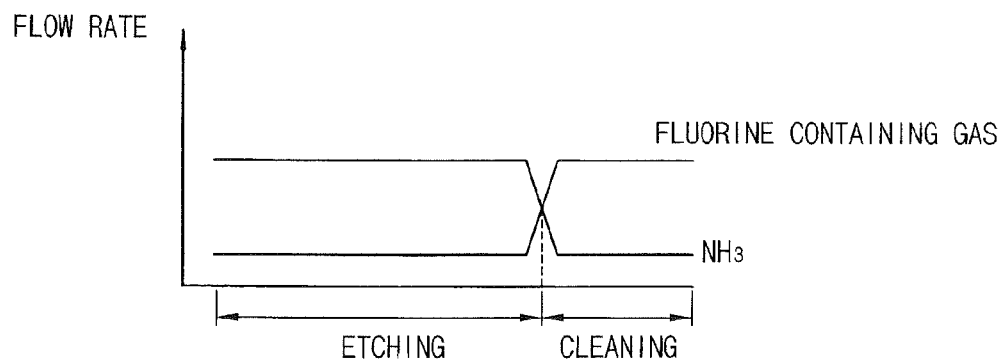

FIG. 13 is a timing diagram illustrating an inflow of reactive gas in an etching process and a cleaning process of a magnetic material layer in accordance with other example embodiments.

First, processes illustrated with reference to FIGS. 1 and 2 may be performed to form a magnetic layer structure 12 as shown in FIG. 2. Then, as illustrated with reference to FIG. 3, the magnetic layer structure 12 may be etched to form a magnetic pattern structure 14.

After the etching process, a cleaning process may be performed to clean a surface of the magnetic pattern structure 14 and remove residual polymers thereon. The etching process and the cleaning process may be performed in situ in an etching chamber.

Hereinafter, the cleaning process is described in detail.

Referring to FIG. 13, a fluorine containing gas and ammonia gas may be used in the cleaning process. The fluorine containing gas may be substantially the same as that of the etching process. Alternatively, the fluorine containing gas may be different from that of the etching process. Examples of the fluorine containing gas may include $SF_6$, $NF_3$, $SiF_4$, $CF_4$ and combinations thereof.

In the cleaning process, a flow rate of the fluorine containing gas may be increased and a flow rate of ammonia gas generating polymers may be decreased. For this reason, the fluorine containing gas may be provided at a flow rate substantially the same as, or more than, that of ammonia gas. In example embodiments, a flow rate ratio between ammonia gas and the fluorine containing gas may be about 1:1 to 50.

The cleaning process may be performed in a time shorter than that of the etching process, thereby to prevent an etching mask on the magnetic pattern structure 14 from being etched excessively by the fluorine containing gas.

The cleaning process may be performed at a temperature of about 10° C. to about 300° C. and at a pressure of about 10 mTorr.

The process conditions (e.g., temperature and/or pressure conditions) of the cleaning process may be substantially the same as, or different from, those of the etching process.

A micro-wave power of about 700 W to about 1500 W and an R.F. bias power of about 200 W to about 700 W may be applied in the cleaning process. The micro-wave power and the R.F. bias power may be substantially the same as, or different from, those of the etching process.

According to the above-described method, a conductive polymer may not remain on the sidewall of the magnetic pattern structure 14 having a MTJ structure.

A magnetic memory device may be formed by the above method.

Particularly, after performing processes substantially the same as those illustrated with reference to FIGS. 5 to 7, the etching and cleaning processes illustrated with reference to FIG. 13 may be performed to form the MTJ structure. Then, the process illustrated with reference to FIG. 9 may be performed to form a STT-MRAM as shown in FIG. 9.

Alternatively, after performing a process substantially the same as that illustrated with reference to FIG. 10, the etching and cleaning processes illustrated with reference to FIG. 13 may be performed to the MTJ structure. Then, the process illustrated with reference to FIG. 11 may be performed to form a magnetic memory device in FIG. 11.

Figure 14:
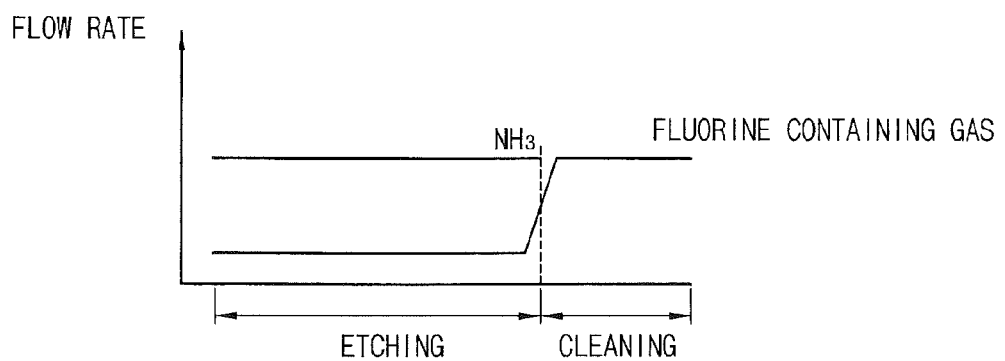

FIG. 14 is a timing diagram illustrating an inflow of reactive gas in an etching process and a cleaning process of a magnetic material layer in accordance with example embodiments.

First, processes illustrated with reference to FIGS. 1 and 2 may be performed to form a magnetic layer structure 12 as shown in FIG. 2. Then, as illustrated with reference to FIG. 3, the magnetic layer structure 12 may be etched to form a magnetic pattern structure 14.

After the etching process, a cleaning process may be performed to clean a surface of the magnetic pattern structure 14 and remove residual polymers thereon. The etching process and the cleaning process may be performed in situ in an etching chamber.

Hereinafter, the cleaning process is described in detail.

Referring to FIG. 14, in the cleaning process, only a fluorine containing gas may be used. The fluorine containing gas may be substantially the same as, or different from, that used in the etching process. Examples of the fluorine containing gas may include $SF_6$, $NF_3$, $SiF_4$, $CF_4$, or combinations thereof.

In the cleaning process, only the fluorine containing gas may be used to clean a surface of the magnetic pattern structure 14 and remove residual polymers. The fluorine containing gas in the cleaning process may be provided at a flow rate substantially the same as, or more than, that of the fluorine containing gas in the etching process.

The cleaning process may be performed in a time shorter than that of the etching process, thereby to prevent an etching mask on the magnetic pattern structure 14 from being etched excessively by the fluorine containing gas.

The cleaning process may be performed at a temperature of about 10° C. to about 300° C. and at a pressure of about 10 mTorr. The process conditions (e.g., temperature and/or pressure) may be substantially the same as, or different from, those of the etching process.

A micro-wave power of about 700 W to about 1500 W and an R.F. bias power of about 200 W to about 700 W may be applied in the cleaning process. The micro-wave power and the R.F. bias power conditions of the cleaning process may be substantially the same as, or different from, those of the etching process.

According to the above-describe method, a conductive polymer may not remain on the sidewall of the magnetic pattern structure 14 having a MTJ structure.

A magnetic memory device may be formed by the above method.

Particularly, after performing processes substantially the same as those illustrated with reference to FIGS. 5 to 7, the etching and cleaning processes illustrated with reference to FIG. 14 may be performed to form the MTJ structure. Then, the process illustrated with reference to FIG. 9 may be performed to form a STT-MRAM as shown in FIG. 9.

Alternatively, after performing a process substantially the same as that illustrated with reference to FIG. 10, the etching and cleaning processes illustrated with reference to FIG. 13 may be performed to the MTJ structure. Then, the process illustrated with reference to FIG. 11 may be performed to form a magnetic memory device in FIG. 11.

Figure 15:
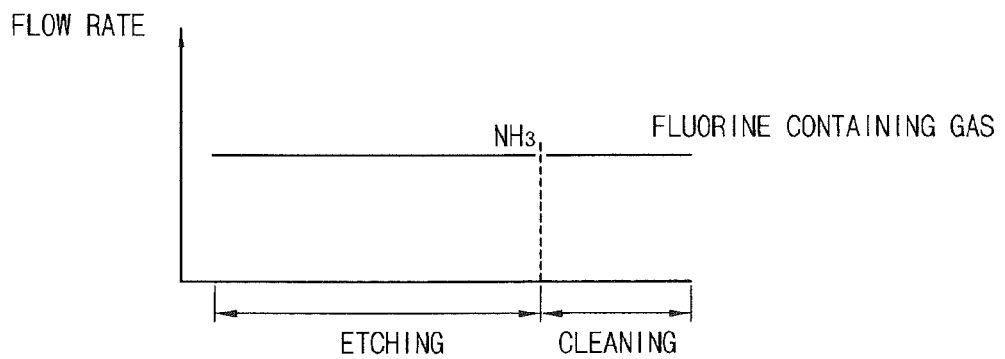

FIG. 15 is a timing diagram illustrating an inflow of reactive gas in an etching process and a cleaning process of a magnetic material layer in accordance with example embodiments.

First, processes illustrated with reference to FIGS. 1 and 2 may be performed to form a magnetic layer structure 12 as shown in FIG. 2. Then, as illustrated with reference to FIG. 3, the magnetic layer structure 12 may be etched to form a magnetic pattern structure 14.

In the etching process, only ammonia gas may be used. Additionally, an inert gas such as argon may be used in the cleaning process.

Ammonia gas may be reacted with a metal of the magnetic layer structure 12 to generate a metal ammonium. The metal ammonium may be volatilized so that the magnetic layer structure 12 may be etched. Ammonia gas may etch the magnetic layer structure 12 rapidly.

The etching process may be performed at a temperature of about 10° C. to about 300° C. and at a pressure of about 10 mTorr. A micro-wave power of about 700 W to about 1500 W and an R.F. bias power of about 200 W to about 700 W may be applied in the cleaning process.

By the above etching process, the magnetic pattern structure 14 may be formed.

After the etching process, a fluorine containing gas may be provided to perform a cleaning process. In the cleaning process, ammonia gas may not be provided, or the inflow of ammonia gas may be decreased. By providing the fluorine containing gas, a surface of the magnetic pattern structure 14 may be cleaned and a remaining polymer may be removed therefrom.

A magnetic memory device may be formed by the above method.

Particularly, after performing processes substantially the same as those illustrated with reference to FIGS. 5 to 7, the etching and cleaning processes illustrated with reference to FIG. 15 may be performed to form the MTJ structure. Then, the process illustrated with reference to FIG. 9 may be performed to form a STT-MRAM as shown in FIG. 9.

Alternatively, after performing a process substantially the same as that illustrated with reference to FIG. 10, the etching and cleaning processes illustrated with reference to FIG. 15 may be performed to the MTJ structure. Then, the process illustrated with reference to FIG. 11 may be performed to form a magnetic memory device in FIG. 11.

Experiments on Magnetoresistance Ratio

MR ratios of MTJ structures formed by the method in accordance with example embodiments and in accordance with a conventional method were measured, respectively, when resistances of tunnel barrier layer patterns of the MTJ structures are varied, and were compared with each other.

EXAMPLES

Figure 16:
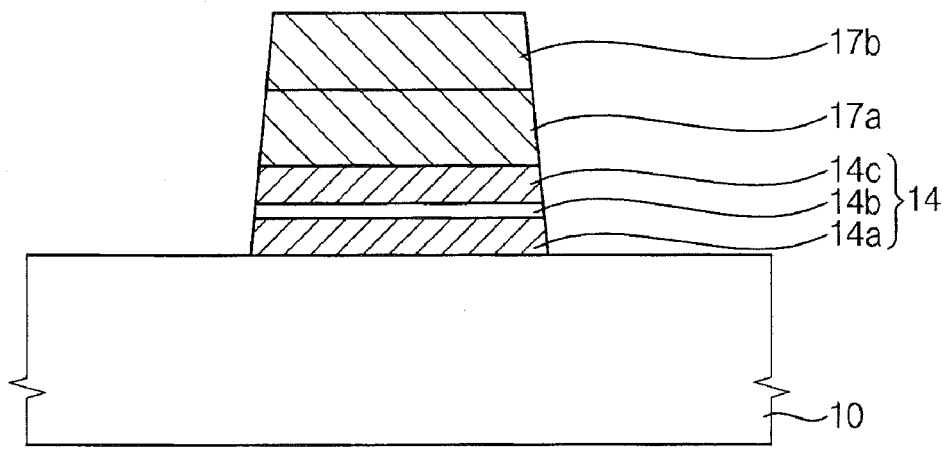

FIG. 16 is a cross-sectional view illustrating a MTJ structure in accordance with Examples.

The MTJ structure was formed as follows.

A MTJ material layer was formed on a substrate 10. Particularly, a first barrier layer (not shown) was formed on the substrate 10 using tantalum (Ta). A fixed layer structure was formed on the first barrier layer. A platinum manganese (PtMn) layer, a CoFe layer, a Ru layer and a CoFe layer were stacked sequentially on the first barrier layer. A second barrier layer (i.e., a tunnel barrier layer) was formed on the fixed layer structure using MgO. A free layer was formed on the tunnel barrier layer using CoFeB.

A mask layer including a titanium/titanium nitride layer and a tantalum layer was formed on the free layer. The mask layer was patterned to form a mask including a titanium/titanium nitride layer pattern 17a and a tantalum layer pattern 17b.

The MTJ material layer was etched using the mask as an etching mask by the etching process described with reference to FIG. 8, thereby forming a MTJ structure 14 including a first barrier layer pattern (not shown), a fixed layer pattern structure 14a, a tunnel barrier layer pattern 14b and a free layer pattern 14c sequentially stacked on the substrate 10. $SF_6$ and $NH_3$ served as an etching gas in the etching process.

By performing the method described above, a plurality of MTJ structures having various resistances of the tunnel barrier pattern 14b was formed. No conductive polymer was detected on a sidewall of the MTJ structure.

COMPARATIVE EXAMPLES

Figure 17:
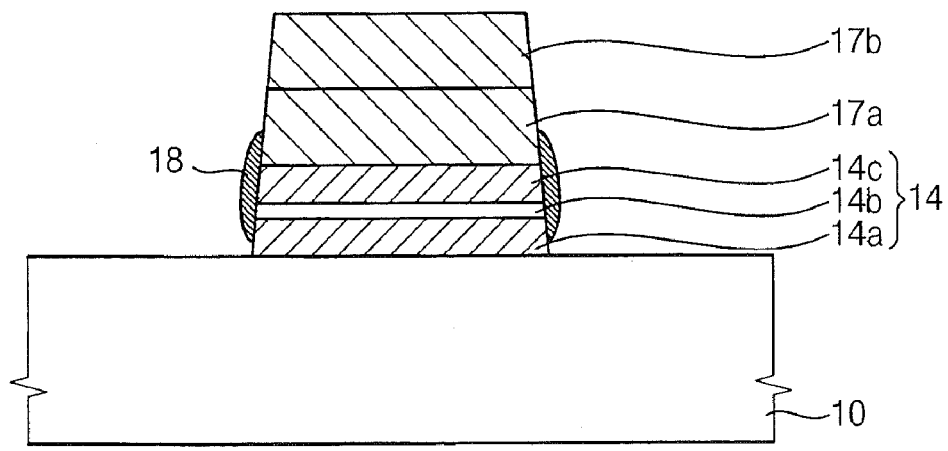

FIG. 17 is a cross-sectional view illustrating a MTJ structure in accordance with Comparative Examples.

The MTJ structure was formed as follows.

A MTJ material layer was formed on a substrate 10. The MTJ material layer was formed by a method substantially the same as that of the above Examples.

The mask including the titanium/titanium nitride layer pattern 17a and the tantalum layer pattern 17b was formed on the MTJ material layer.

The MTJ material layer was etched using the mask as an etching mask by an etching process in which $Cl_2$ and argon served as an etching gas, thereby forming the MTJ structure 14.

By performing the method described above, a plurality of MTJ structures having various resistances of the tunnel barrier pattern 14b was formed. Magnetic materials etched from the MTJ material layer were re-deposited on a sidewall of the MTJ structure 14 because the magnetic materials were not volatilized easily in the etching process using the halogen gas as the etching gas.

The MR ratios of the MTJ structures in the Examples and the Comparative Examples were measured.

Figure 18:
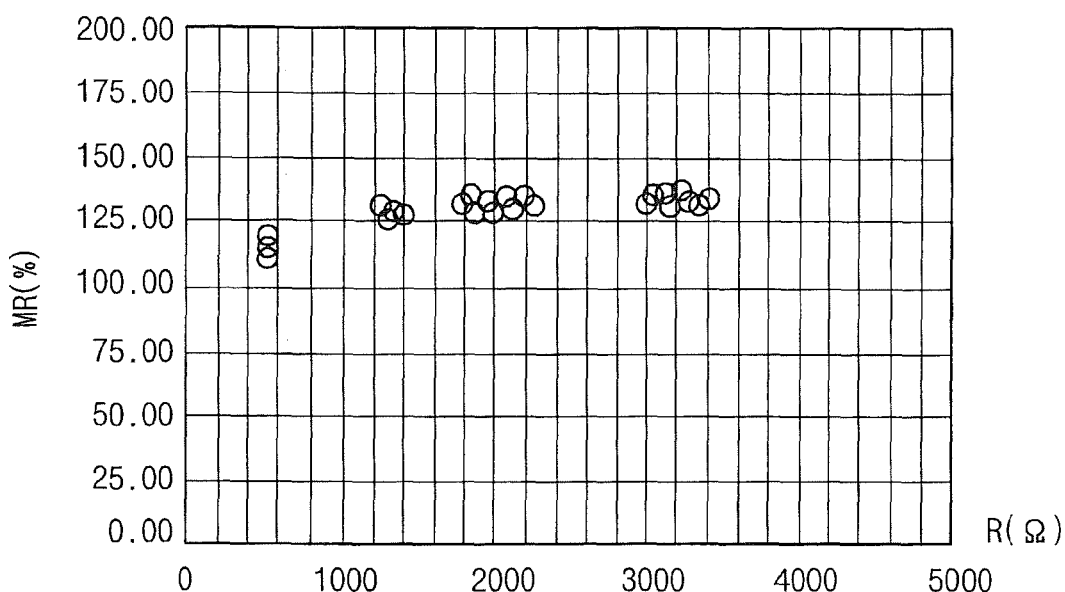

FIG. 18 is a graph showing the MR ratios of the MTJ structures in the Example.

Referring to FIG. 18, the MR ratios of the MTJ structures were higher than about 120%, regardless of the resistance of the tunnel barrier layer pattern 14b included in the MTJ structures. The fixed layer pattern structure 14a and the free layer pattern 14c were not short-circuited to each other. Thus, the MTJ structures did not have MR ratios lower than about 20%.

The MR ratios of the MTJ structure in the Comparative Examples were measured.

Figure 19:
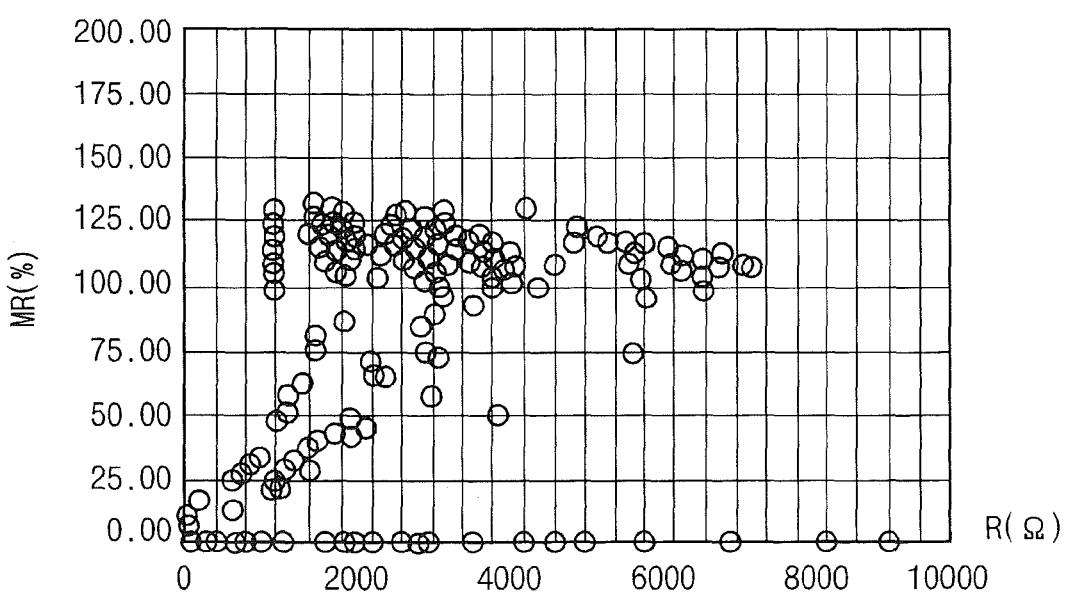

FIG. 19 is a graph showing the MR ratios of the MTJ structures in the Comparative Examples.

Referring to FIG. 19, many of the MTJ structures had a MR ratio lower than about 70%. Additionally, some of MTJ structures had a MR ratio of about 0% due to the electrical short between the fixed layer pattern structure 14a and the free layer pattern 14c.

According to FIGS. 18 and 19, the MTJ structures in accordance with the Examples may have a substantially high MR ratio and less defects.

Figure 20:
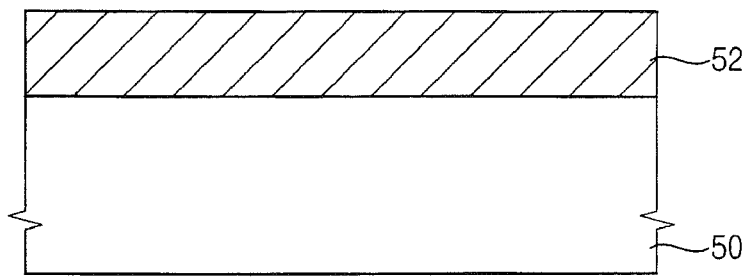
Figure 21:
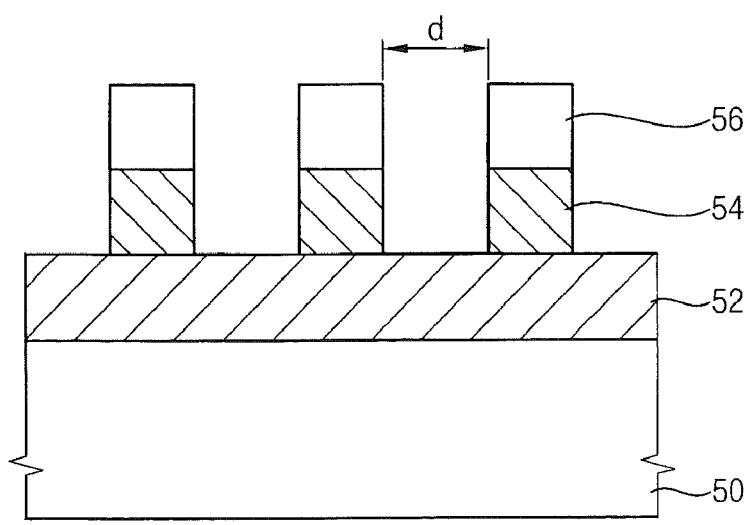
Figure 22:
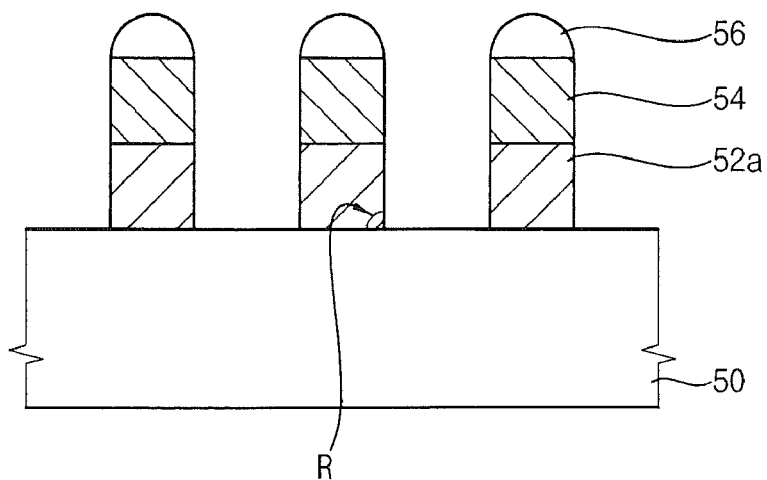

FIGS. 20 to 22 are cross-sectional views illustrating a method of forming a phase change pattern in accordance with example embodiments.

Referring to FIG. 20, a phase change layer 52 may be formed on a substrate 50 using a phase change material such as an alloy including at least three elements of germanium (Ge), antimony (Sb), tellurium (Te), indium (In) bismuth (Bi), and combinations thereof. For example, the phase change layer 52 may be formed using an alloy including Ge, Sb and Te ($Ge_2Sb_2Te_5$, GST), an alloy including In, Sb and Te (IST) and an alloy including Ge, Bi and Te (GBT), etc. In example embodiments, the phase change layer 52 may be formed using GST. GST is a material widely used for a commercialized phase change optical storage devices (e.g., CD-RW or DVD, etc.), and is recognized as a very stable material.

Referring to FIG. 21, a first mask layer (not shown) may be formed on the phase change layer 52. The first mask layer may be formed using a metal or a metal nitride (e.g., titanium, titanium nitride, tantalum, tantalum nitride, tungsten, tungsten nitride, or a similar compound.). These may be used alone, or in a combination thereof.

A second mask layer (not shown) may be formed on the first mask layer. The second mask layer may serve as an etching mask for patterning the first mask layer. The second mask layer may be formed using silicon nitride.

The second mask layer may be patterned, thereby forming a plurality of second masks 56. The first mask layer may be etched using the second masks 56 as an etching mask. By performing the process, a plurality of first masks 54 serving as an etching mask for etching the phase change layer 52 may be formed. A gap (d) between the first masks 54 may be less than about 1000 Å.

Referring to FIG. 22, the phase change layer may be etched using the first and second masks 54 and 56 as an etching mask by a plasma reactive etching process in which ammonia gas is used as an etching gas. Accordingly, a plurality of phase change patterns 52a may be formed on the substrate 50.

Ammonia gas may be reacted with the phase change material included in the phase change layer 52, and the reactants may be volatilized, thereby etching the phase change layer 52.

When ammonia gas serves as an etching gas, no elements of Ge, Sb and Te included in the phase change layer 52 may be etched faster than other elements therein, that is, every element included in the phase change layer 52 may be etched at substantially the same rate. Therefore, the composition ratio of the phase change layer 52 may maintain substantially uniformly in the etching process. Particularly, every element included in the phase change patterns 52a may have a difference of proportion less than about 5% between before and after performing the etching process.

Even though the area of the phase change layer to be etched is very narrow, the etching rate may not be decreased. Accordingly, the phase change patterns 52a may have a good vertical profile and a narrow pitch. Particularly, the acute angle R of sidewalls of the phase change patterns 52a with respect to a top surface of the substrate 50 may be more than about 80°.

The gap between the phase change patterns 52a may be less than about 1000 Å. As described above, even though the phase change patterns 52a are formed to have the narrow gap, there may be no lower portion of the phase change layer 52 that is not etched.

Etching conditions for etching the phase change layer 52 may be as follows. The etching process may be performed at a temperature of about 10° C. to about 300° C. and at a pressure of about 10 mTorr. A micro-wave power of about 700 W to about 1500 W and R.F. bias power of about 200 W to about 700 W may be applied in the etching process.

If a halogen gas (e.g., chlorine and fluorine) is used for etching the phase change layer 52, etching rates of the elements therein may be different from one another due to the difference of the reactivities of the elements included in the phase change layer 52. Accordingly, the composition ratio of the phase change layer 52 may change greatly in the etching process. When a proportion of a specific element included in the phase change pattern 52a is substantially increased or decreased, the phase change pattern 52a may have poor phase change characteristics, and further the phase change pattern 52a may collapse because the coherence of the elements therein may become weak.

However, in accordance with example embodiments, the reactivities between ammonia gas and the elements of the phase change layer 52 may be substantially the same, or very similar. Accordingly, the phase change pattern 52a may have good phase change characteristics, and the sidewall profile of the phase change pattern 52a may be also good.

If the phase change layer 52 is etched by a conventional etching process, the phase change pattern 52a may be damaged by an etching gas including fluorine or chlorine remaining on a surface of the phase change pattern 52a even after the etching process is performed. Therefore, the phase change pattern 52a may have poor reliability. However, when the phase change layer 52 is etched using ammonia gas in accordance with example embodiments, the surface of the phase change pattern 52a may be protected by nitrogen remaining on the surface of the phase change pattern 52a after the etching process is performed. Therefore, the phase change pattern 52a may not be damaged by the etching gas. Accordingly, the phase change pattern 52a may have good reliability.

If the phase change layer 52 is etched by a conventional physical etching process, the composition ratio of the phase change layer 52 may not be changed in the etching process, however, a sidewall profile of the phase change pattern 52a may not be good. Additionally, when the phase change patterns 52a are formed to have the narrow gap, there may be lower portions of the phase change layer 52 that are not etched.

In accordance with example embodiments, however, the phase change layer 52 is not etched by a physical etching process, and thus the phase change pattern 52a may have a narrow pitch and good sidewall profile.

FIGS. 23 to 26 are cross-sectional views illustrating a method of manufacturing a phase change memory device in accordance with example embodiments.

The etching processes illustrated with reference to FIGS. 21 and 22 may be used for manufacturing the phase change memory device in accordance with example embodiments.

Figure 23:
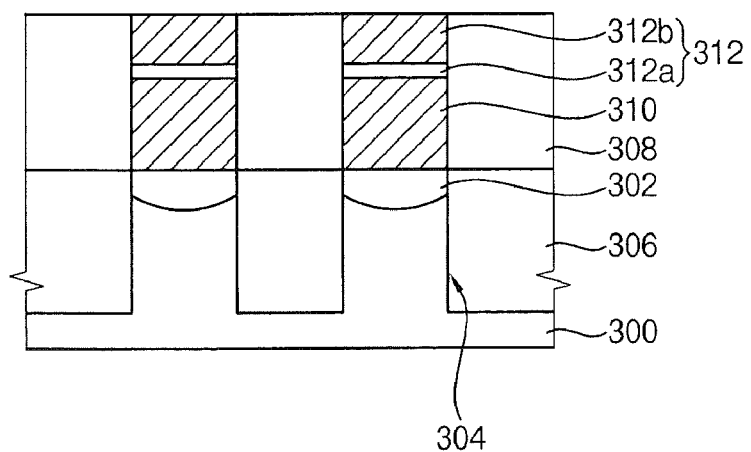

Referring to FIG. 23, an impurity region 302 may be formed by implanting, for example, n-type impurities into an upper portion of a substrate 300. An upper portion of the substrate 300 may be etched to form a plurality of trenches 304 in a second direction, each of which may extend in a first direction perpendicular to the second direction. An isolation layer may be formed on the substrate 10 to fill the trench 304, and an upper portion of the isolation layer may be planarized to form an isolation layer pattern 306 in the trench 304.

A first insulation layer 308 may be formed on the substrate 300 and the isolation layer pattern 306. A first opening (not shown) exposing the impurity region 302 may be formed by partially etching the first insulation layer 308. A silicon layer may be formed on the first insulation layer 308 and the impurity region 302 to fill the first opening, and an upper portion of the silicon layer may be planarized to form a silicon layer pattern partially filling the first opening.

An upper portion of the silicon layer pattern may be implanted with p-type impurities, and a lower portion of the silicon layer pattern may be implanted with n-type impurities to form a diode 310 in the first opening.

A pad electrode 312 having a metal silicide layer 312a and a metal layer 312b sequentially stacked may be formed to fill a remaining portion of the first opening.

Figure 24:
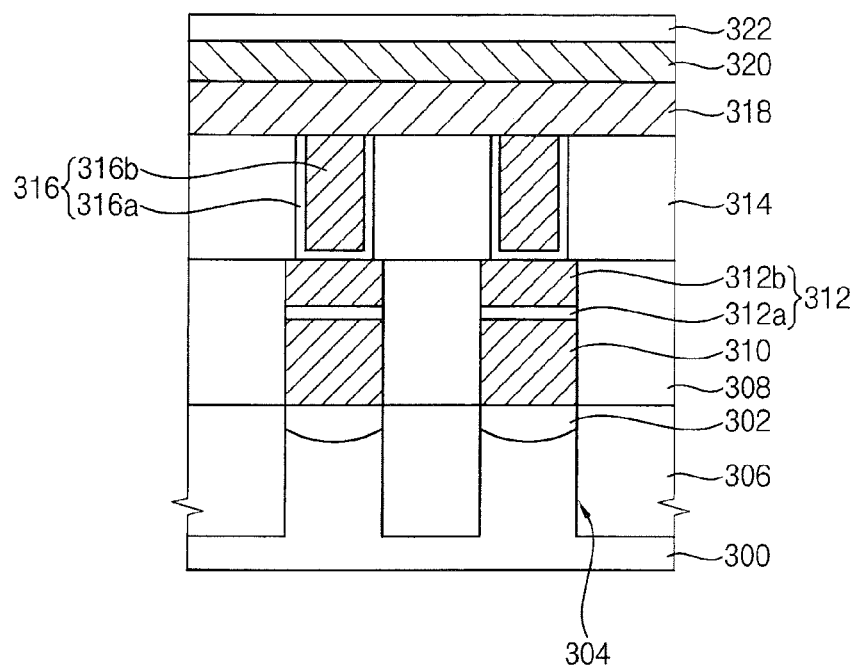

Referring to FIG. 24, a second insulation layer 314 may be formed on the first insulation layer 308 and the pad electrode 312. The second insulation layer 314 may be partially etched to form a second opening (not shown) exposing a top surface of the pad electrode 312.

A lower electrode contact 316 may be formed on the top surface of the pad electrode 312 to fill the second opening. Particularly, a barrier layer may be formed on an inner wall of the second opening and the second insulation layer 314. A metal layer may be formed on the barrier layer to fill a remaining portion of the second opening. The barrier layer may be formed using titanium, titanium nitride, etc. These may be used alone, or in a combination thereof. The metal layer may be formed using tungsten, aluminum, copper, etc. Upper portions of the metal layer and the first barrier layer may be planarized until a top surface of the second insulation layer 314 is exposed to form the lower electrode contact 316 including a barrier layer pattern 316a and a metal layer pattern 316b sequentially stacked on the top surface of the pad electrode 312.

A phase change layer 318 may be formed on the second insulation layer 314 and the lower electrode contact 316. The phase change layer 318 may be formed using an alloy including at least three of Ge, Sb, Te, In, and Bi. In the present example embodiments, the phase change layer 318 may be formed using GST. The phase change layer 318 may be formed by a physical vapor deposition (PVD) process, a chemical vapor deposition (CVD) process, a sol-gel process, an atomic layer deposition (ALD) process and a cyclic chemical vapor deposition (cyclic CVD) process, etc.

An upper electrode layer 320 may be formed on the phase change layer 318. The upper electrode layer 320 may be formed using titanium nitride. A hard mask layer 322 may be formed on the upper electrode layer 320. The hard mask layer 322 may be formed using silicon nitride.

Figure 25:
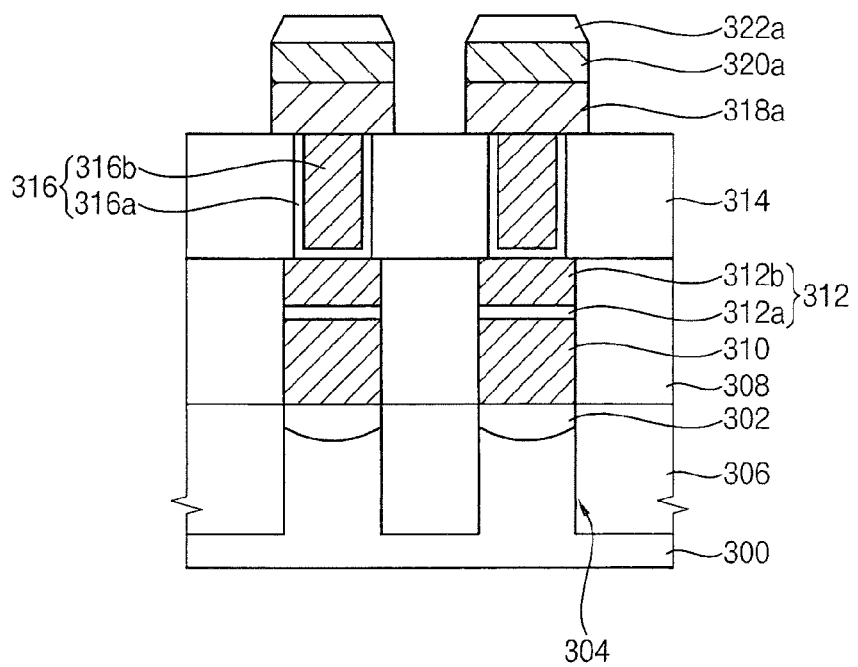

Referring to FIG. 25, a hard mask 322a may be formed by patterning the hard mask layer 322. An upper electrode 320a may be formed by patterning the upper electrode layer 320 using the hard mask 322a as an etching mask.

The phase change layer 318 may be etched using the upper electrode 320a and the hard mask 322a as an etching mask. Particularly, the phase change layer 318 may be etched by a plasma reactive etching process using ammonia gas as an etching gas to form a phase change pattern 318a. The process of etching the phase change layer 318 may be substantially the same as that illustrated with reference to FIG. 22.

The composition ratio of the phase change pattern 318a may be substantially the same as that of the phase change layer 318. The phase change pattern 318a may not have an etching damage in the etching process and may have a good vertical profile. Additionally, even though a plurality of the phase change patterns 318a is formed to have a very narrow gap therebetween, there may be no lower portion of the phase change layer 52 that is not undesirably etched.

Figure 26:
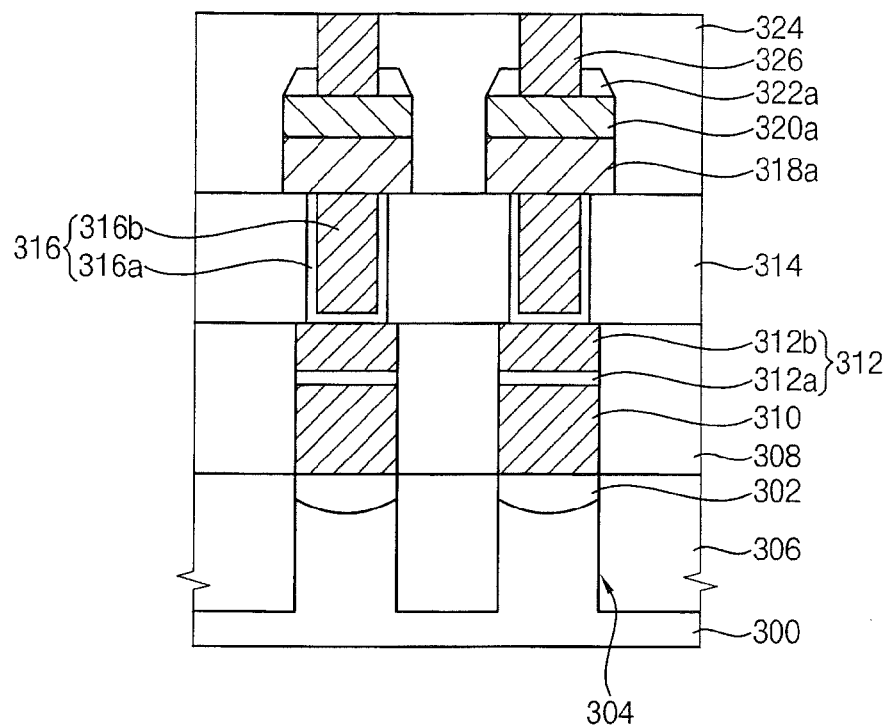

Referring to FIG. 26, a third insulation layer 324 may be formed on the second insulation layer 314 to cover the hard mask 322a, the upper electrode 320a and the phase change pattern 318a.

A contact hole may be formed through the third insulation layer 324 and the hard mask 322a to expose a top surface of the upper electrode 320a. A conductive layer may be formed on the top surface of the upper electrode 320a and the third insulation layer 324 to fill the contact hole, and an upper portion of the conductive layer may be planarized to form an upper electrode contact 326 in the contact hole. The conductive layer may be formed using a metal (e.g., tungsten). A wiring (not shown) may be further formed on the upper electrode contact 326.

As described above, the phase change memory device having good quality may be manufactured.

Figure 27:
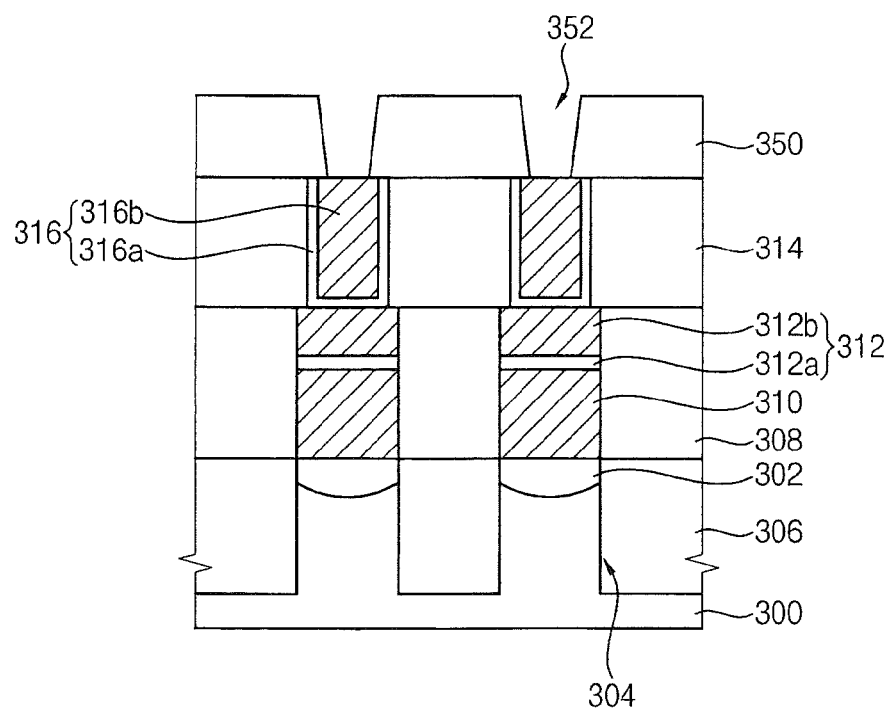
Figure 28:
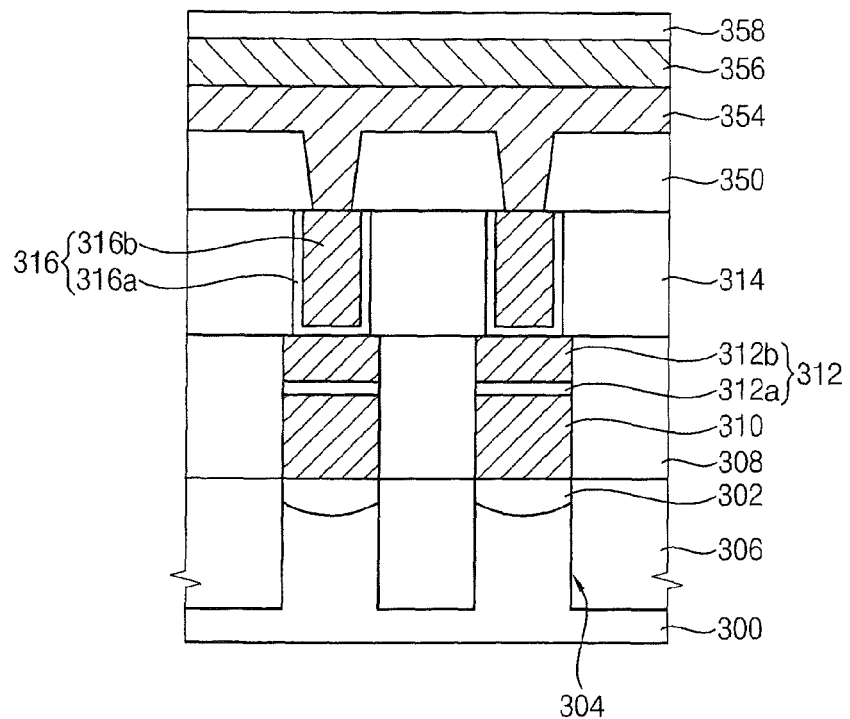
Figure 29:
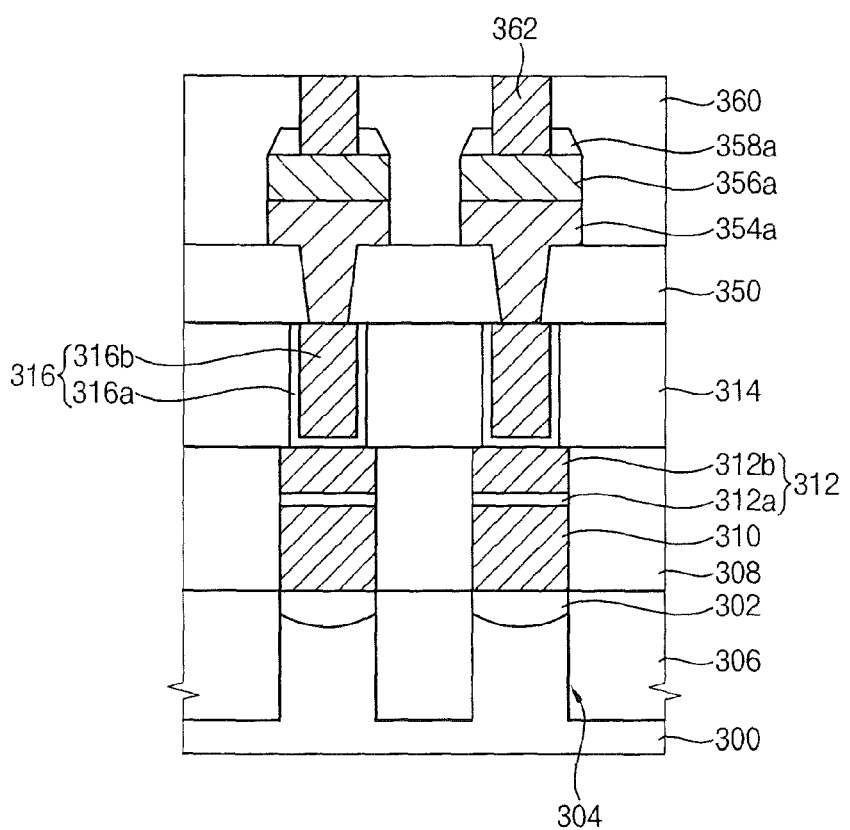

FIGS. 27 to 29 are cross-sectional views illustrating a method of manufacturing a phase change memory device in accordance with example embodiments.

The etching method described with reference to FIGS. 21 and 22 is used for manufacturing a phase change memory device in accordance with the present example embodiments.

The processes described with reference to FIG. 23 are performed in the present example embodiments.

Referring to FIG. 27, a second insulation layer 314 may be formed on a first insulation layer 308 and a pad electrode 312. The second insulation layer 314 may be partially etched to form a lower electrode contact 316 contacting with a top surface of the pad electrode 312. The process described above may be same as that described with reference to FIG. 24.

A third insulation layer 350 may be formed on the second insulation layer 314 and the lower electrode contact 316. The third insulation layer 350 may be formed using a silicon oxide, and may be formed using a silicon oxide having a high density. For example, the third insulation layer 350 may be formed using a silicon oxide formed by a high density plasma process.

The third insulation layer 350 may be partially etched to form an opening 352 exposing a top surface of the lower electrode contact 316. The opening 352 may have a sidewall slope, so that the longitudinal section of the opening 352 may have a reversed trapezoidal shape. In this case, the contact area of the lower electrode contact 316 with a phase change pattern formed in a subsequent process may be decreased.

Referring to FIG. 28, a phase change layer 354 may be formed on the third insulation layer 350. The phase change layer 354 may fill the opening 352. An upper electrode layer 356 may be formed on the phase change layer 354. A hard mask layer 358 may be formed on the upper electrode layer 356.

Referring to FIG. 29, the hard mask layer 358 may be patterned to form a hard mask 358a. The upper electrode layer 356 may be patterned to form an upper electrode 356a. The upper electrode 356a may be formed overlapping (or corresponding) to the opening 352.

The phase change layer 354 may be etched using the upper electrode 356a and the hard mask 358a as an etching mask, thereby forming a phase change pattern 354a. Particularly, the phase change layer 354 may be etched by a plasma reactive etching process using ammonia gas as an etching gas. The process of etching the phase change layer 354 may be substantially the same as that described with reference to FIG. 22.

A fourth insulation layer 360 covering the upper electrode 356a may be formed on the third insulation layer 350. Additionally, an upper electrode contact 362 may be formed through the fourth insulation layer 360. A wiring (not shown) may be formed on the upper electrode contact 362.

A method of forming phase change patterns in accordance with example embodiments may be substantially the same as that illustrated with reference to FIGS. 20 to 23, except for a condition of an etching gas.

Particularly, the process illustrated with reference to FIGS. 20 to 21 is performed to form a phase change layer 52, a first mask pattern 54 and a second mask pattern 56 shown in FIG. 21.

A phase change pattern 52a may be formed by performing a plasma reactive etching process to the phase change layer using ammonia gas and an assistance etching gas as an etching gas. Examples of the assistance etching gas may include $CF_4$, carbon monoxide (CO), hydrogen bromide (HBr), $SF_6$, etc. These may be used alone, or in combinations thereof. An inert gas may be used in addition to ammonia gas and the assistance gas in the etching process. Examples of the inert gas may include argon and helium, etc. An etching condition in the etching chamber may be controlled by using the inert gas.

A shape of the phase change pattern 52a may be controlled easily by using the inert gas. An intake flow may be controlled considering the width and height of the phase change pattern 52a, the gap between the phase change pattern 52a and the sidewall slope of the phase change pattern 52a, etc. Additionally, an etching rate of the phase change layer may be controlled by controlling the intake flow of the assistance gas.

The etching process may be performed at a temperature of about 10° C. to about 300° C. and at a pressure of about 10 mTorr. A micro-wave power of about 700 W to about 1500 W and R.F. bias power of about 200 W to about 700 W may be applied in the etching process.

When the phase change patterns are formed in accordance with the present example embodiments, no elements of Ge, Sb and Te included in the phase change layer 52 may be etched faster than other elements therein. Every element included in the phase change layer 52 may be etched at substantially the same rate. Therefore, the composition ratio of the phase change layer 52 may maintain substantially uniformly in the etching process. Particularly, an etching damage may be rarely generated to the phase change layer in the etching process.

Additionally, even though the area of the phase change layer to be etched is very narrow, the etching rate may not be decreased. Accordingly, the phase change patterns may have a good vertical profile and a narrow pitch.

A phase change memory device may be manufactured by the etching process of the present example embodiments.

In example embodiments, after performing the process described with reference to FIGS. 23 and 24, a phase change layer may be etched by the etching method of the present example embodiments to form phase change patterns. And, a phase change memory device in FIG. 26 may be manufactured by performing the process described with reference to FIG. 26.

In other example embodiments, after performing the process described with reference to FIGS. 27 and 28, a phase change layer may be etched by the etching method of the present example embodiments to form phase change patterns. And, a phase change memory device in FIG. 29 may be manufactured by performing the process described with reference to FIG. 29.

Experiments on a Variation of Composition Ratio of each Phase Change Pattern of Examples and Comparative Example 1 in an Etching Process.

A phase change pattern formed by the method in accordance with example embodiments and in accordance with a conventional method were measured, respectively, and were compared with each other.

Example 1

A GST layer was formed on a substrate. A phase change pattern was formed by etching the GST layer using the etching method illustrated with reference to FIGS. 20 and 22. Particularly, the phase change pattern was formed by etching the GST layer using ammonia gas as an etching gas in a plasma etching process.

Example 2

A GST layer was formed on a substrate. A phase change pattern was formed by etching the GST layer using the etching method illustrated with reference to FIGS. 20 and 24. Particularly, the phase change pattern was formed by etching the GST layer using ammonia gas and argon gas as an etching gas in a plasma etching process.

Comparative Example 1

A GST layer was formed on a substrate. A phase change pattern was formed by etching the GST layer using HBr, $CF_4$, and Ar as an etching gas in a plasma etching process.

Figure 30:
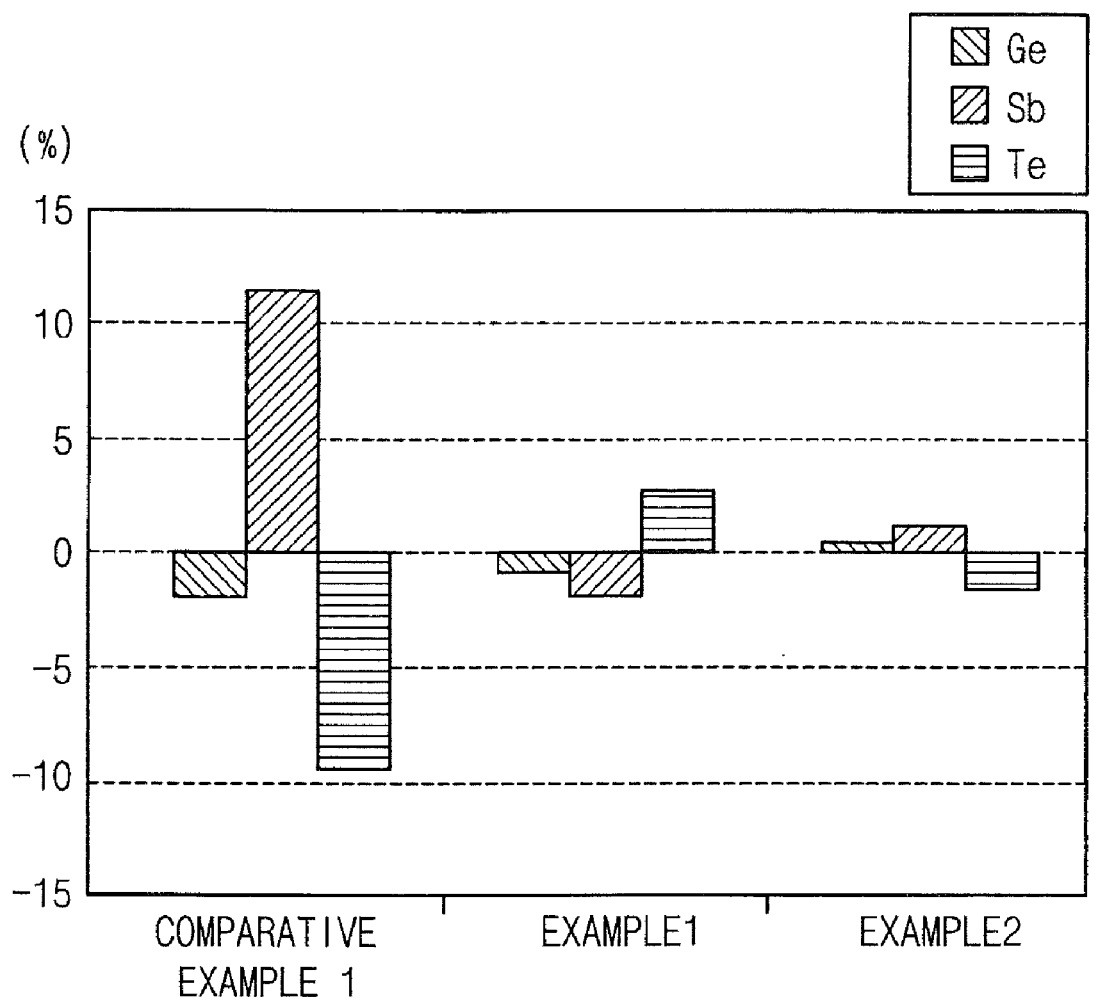

FIG. 30 is a graph showing a variation of composition ratio of each phase change pattern of Example 1, Example 2 and Comparative Example 1 in an etching process.

Referring to FIG. 30, an amount of the each element included in the phase change pattern after performing the etching process respectively had a difference of less than about 5% in comparison with that of the each element included in the GST layer before performing the etching process in Examples 1 and 2. With the result that the composition ratio of each phase change pattern of Examples 1 and 2 was hardly changed in the etching process, when the GST layer was formed by the method of the present example embodiments, a specific element included in the GST layer was not etched in a high or low etching rate, but each element included in the GST layer was etched in a uniform etching rate.

Accordingly, the phase change pattern has good profile, and each element included in the phase change pattern was combined stably with each other.

On the other hand, an amount of the each element included in the phase change pattern after performing the etching process respectively had the relatively great difference in comparison with that of each element included in the GST layer before performing the etching process in Comparative Example 1. Particularly, an amount of Sb included in the phase change pattern after performing the etching process was increased greatly in comparison with that of Sb included in the GST layer before performing the etching process. However, an amount of Te included in the phase change pattern after performing the etching process was decreased greatly in comparison with that of Te included in the GST layer before performing the etching process. Te included in the GST layer was etched at a relatively high etching rate, however Sb included in the GST layer was etched at a relatively low etching rate. As a result, the amount of Sb and Te included in the phase change pattern after performing the etching process respectively had a substantial difference in comparison with that of Sb and Te included in the GST layer before performing the etching process.

As illustrated above, when an amount of a specific element included in the phase change pattern 52a is increased or decreased, the phase change pattern may have unfavorable phase change characteristics, and the coherence of the elements included in the phase change pattern may become weak, so that the phase change pattern may collapse in a subsequent process.

Figure 31:
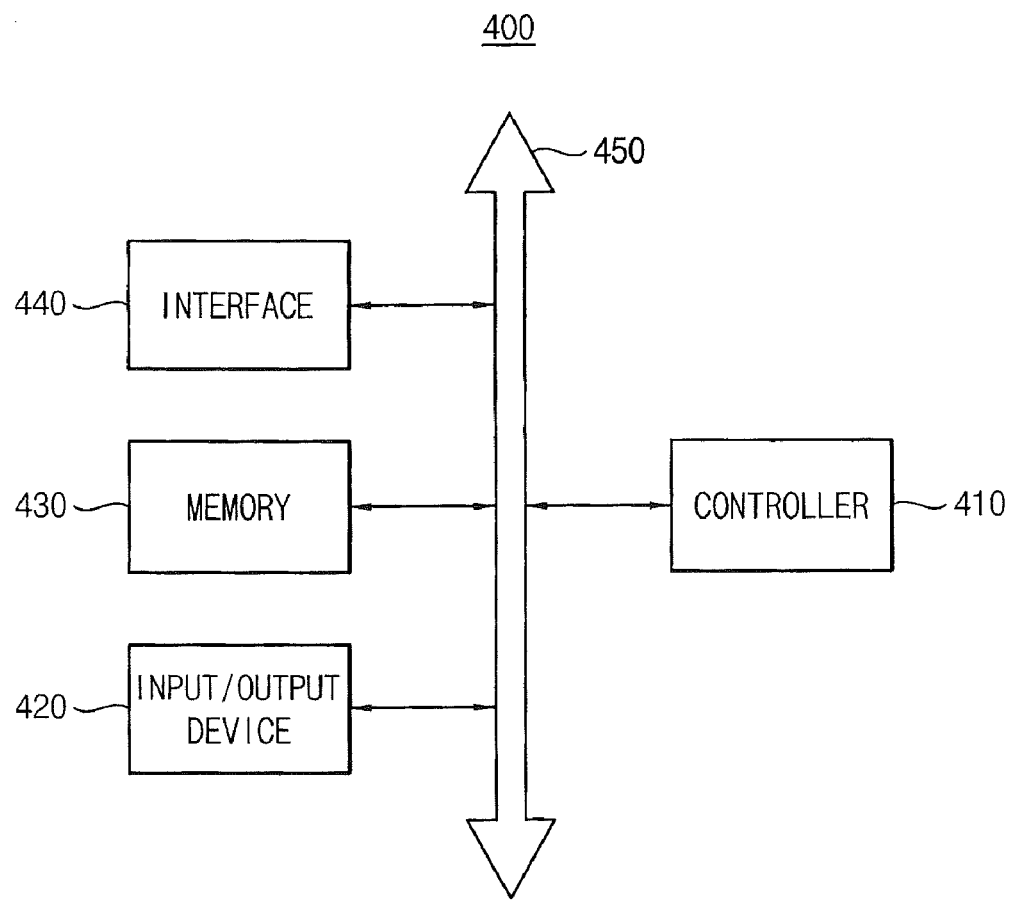

FIG. 31 is a block diagram illustrating a memory system in accordance with example embodiments.

Referring to FIG. 31, a system 400 includes a controller 410, an input/output device 420, a memory 430, an interface 440, and a bus 450. The system 400 may include a mobile system (e.g., a personal data assistance (PDA), a portable computer, a web tablet, a wireless phone, a mobile phone, a digital music player, or a memory card). In example embodiments, the system 400 can be any system transmitting and/or receiving information. The controller 410 may include, for example, a microprocessor, a digital signal processor, or a microcontroller. The I/O device 420 may include a keypad, keyboard or display. The memory 430 can include, for example, a DRAM or a flash memory. The memory 430 can store commands executed by the controller 410. The memory 430 and the interface 440 can be combined by the bus 450. The system 400 can use the interface 440 to transmit data into a communication network or to receive data from the communication network.

Figure 32:
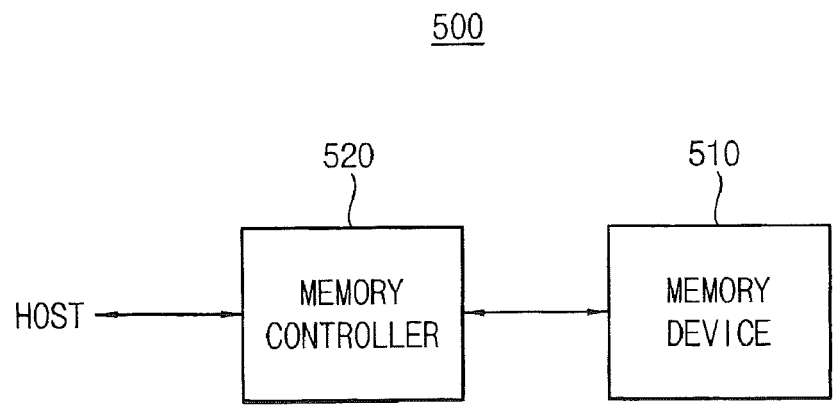

FIG. 32 is a block diagram illustrating a memory card in accordance with example embodiments.

Referring to FIG. 32, the memory card 500 includes a memory controller 520 and a memory device 510 electrically connected to the memory controller 520. The memory device 510 may include a flash memory device having at least one buried shield structure. Here, the flash memory device may be manufactured through the above-described processes. Alternatively, the memory device 510 may include other non-volatile semiconductor memory devices or volatile semiconductor devices (e.g., DRAM devices, SRAM devices, etc.). The memory controller 520 may provide an input signal into the memory device 510 to control the reading and the erasing operations of the memory device 510. For example, various signals (e.g., command (CMD), address (ADD), input/output data (DQ) or a high-voltage (VPP) signal) may be applied to the memory controller 520. The memory controller 520 may control the memory device 510 based on the applied various signals. The memory system may be employed in various electronic apparatuses (e.g., a cellular phone, a portable multimedia player, a digital camera, etc.).

Foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the example embodiments of the present inventive concepts. Accordingly, all such modifications are intended to be included within the scope of the example embodiments of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming pattern structures, the method comprising:
    forming an etching object layer on a substrate, the etching object layer including a magnetic material or a phase change material; and
    performing a plasma reactive etching process on the etching object layer using a mixed etching gas including at least ammonia ($NH_3$) gas and a fluorine containing gas.

2. The method of claim 1, wherein the etching object layer includes an alloy of at least two elements selected from the group consisting of cobalt (Co), iron (Fe), terbium (Tb), ruthenium (Ru), palladium (Pd), platinum (Pt), manganese (Mn) and combinations thereof.

3. The method of claim 2, wherein the fluorine containing gas includes at least one selected from the group consisting of sulfur hexafluoride ($SF_6$), nitrogen trifluoride ($NF_3$), silicon tetrafluoride ($SiF_4$), carbon tetrafluoride ($CF_4$) and combinations thereof.

4. The method of claim 2, wherein a flow rate of the ammonia gas included in the etching gas is equal to or greater than that of the fluorine containing gas included in the etching gas.

5. The method of claim 1, further comprising removing a polymer attached to sidewalls of the pattern structures, after performing the plasma reactive etching process.

6. The method of claim 1, wherein the etching object layer includes an alloy of at least three elements selected from the group consisting of germanium (Ge), antimony (Sb), tellurium (Te), indium (In), bismuth (Bi) and combinations thereof.

7. The method of claim 6, wherein the etching gas includes at least one of argon, $CF_4$, carbon monoxide (CO), hydrogen bromide (HBr), $SF_6$ and combinations thereof.

8. The method of claim 6, wherein each element in the pattern structures has a difference of proportion less than about 5% between before and after performing the plasma reactive etching process.

9. The method of claim 6, wherein a gap between pattern structures is less than about 1000 Å.

10. The method of claim 6, wherein an acute angle of sidewalls of the pattern structures with respect to a top surface of the substrate is equal to or more than 80°.

11. A method of manufacturing a magnetic memory device, the method comprising:
    providing a cell selection device;
    forming an insulating interlayer covering the cell selection device;
    forming the etching object layer according to claim 1 on the insulating interlayer, wherein the etching object layer includes a lower magnetic layer, a tunnel barrier layer and an upper magnetic layer, and the upper magnetic layer includes the magnetic material;
    forming a mask on the upper magnetic layer; and
    performing the plasma reactive etching process on the upper magnetic layer, the tunnel barrier layer and the lower magnetic layer to form a Magnetic Tunnel Junction (MTJ) structure, wherein the etching gas is a mixed gas including a fluorine containing gas and the ammonia gas.

12. The method of claim 11, wherein the mixed gas further includes an inert gas.

13. The method of claim 11, wherein the plasma reactive etching process is performed at a temperature of 10° C. to 300° C. and at a pressure of 1 mTorr to 10 mTorr.

14. The method of claim 11, wherein the fluorine containing gas includes at least one selected from the group consisting of $SF_6$, $NF_3$, $SiF_4$, $CF_4$ and combinations thereof.

15. The method of claim 11, further comprising forming an insulative metal oxide layer on a sidewall of the MTJ structure.

16. The method of claim 11, wherein a flow rate of the ammonia gas included in the mixed gas is equal to or greater than that of the fluorine containing gas included in the mixed gas.

17. A method of manufacturing a phase change memory device, the method comprising:
    forming a cell selection device on a substrate;
    forming an insulating interlayer on the substrate and covering the cell selection device;
    forming a lower electrode contact through the insulating interlayer, the lower electrode contact contacting the cell selection device;
    forming a phase change layer electrically connected to the lower electrode contact on the insulating interlayer;
    performing a plasma reactive etching process on the phase change layer using an etching gas including ammonia gas and at least one selected from the group consisting of argon, CF4, carbon monoxide (CO), hydrogen bromide (HBr), SF6 and combinations thereof to form a phase change pattern; and
    forming an upper electrode contacting the phase change pattern.

18. The method of claim 17, wherein an acute angle of sidewalls of the phase change pattern with respect to a top surface of the substrate is equal to or more than 80° by preventing variations in the composition ratio of the phase change layer during the plasma reactive etching process.

19. The method of claim 5, wherein the removing a polymer attached to sidewalls of the pattern structures includes a cleaning process with a lower ratio of ammonia gas to fluorine-containing gas compared to the ratio of ammonia gas to fluorine-containing gas in the etching gas used for the plasma reactive etching process on the etching object layer.

* * * * *